United States Patent
Maruyama

(10) Patent No.: US 7,626,532 B2
(45) Date of Patent: Dec. 1, 2009

(54) A/D CONVERTER

(75) Inventor: Masahiko Maruyama, Kyoto (JP)

(73) Assignee: Sharp Kabushiki Kaisha, Osaka (JP)

( * ) Notice: Subject to any disclaimer, the term of this patent is extended or adjusted under 35 U.S.C. 154(b) by 119 days.

(21) Appl. No.: 12/020,425

(22) Filed: Jan. 25, 2008

(65) Prior Publication Data

US 2009/0021411 A1 Jan. 22, 2009

(30) Foreign Application Priority Data

Jan. 30, 2007 (JP) ............................. 2007-018771

(51) Int. Cl.
*H03M 1/56* (2006.01)
(52) U.S. Cl. ....................... 341/169; 341/164
(58) Field of Classification Search ................. 341/164, 341/165, 169, 170
See application file for complete search history.

(56) References Cited

U.S. PATENT DOCUMENTS

| | | | | |
|---|---|---|---|---|
| 3,579,105 A * | 5/1971 | Scott | ........................... | 341/170 |
| 4,291,297 A * | 9/1981 | Kanemaru et al. | .......... | 341/169 |
| 6,545,624 B2 * | 4/2003 | Lee et al. | .................... | 341/155 |
| 7,345,613 B2 * | 3/2008 | Higuchi | ...................... | 341/155 |
| 7,414,553 B1 * | 8/2008 | Tsyrganovich | .............. | 341/118 |
| 7,532,148 B2 * | 5/2009 | Muramatsu et al. | ......... | 341/169 |
| 2006/0001564 A1 * | 1/2006 | Yamagata et al. | ........... | 341/169 |

FOREIGN PATENT DOCUMENTS

| | | |
|---|---|---|
| JP | 57-160221 A | 10/1982 |
| JP | 2000-286706 A | 10/2000 |

* cited by examiner

*Primary Examiner*—Howard Williams
(74) *Attorney, Agent, or Firm*—Birch, Stewart, Kolasch & Birch LLP

(57) ABSTRACT

An A/D converter comprises a ramp voltage generation circuit, a voltage comparison circuit comprising an arithmetic unit comparing an analog voltage to be converted with a reference voltage showing the voltage change of a ramp voltage, and changing an output when the reference voltage equals the analog voltage, a counter counting and outputting a digital value corresponding to the reference voltage, a latch circuit latching and outputting the digital value when the output of the voltage comparison circuit changes, an averaging process circuit to obtain an average noise voltage, a target noise voltage setting circuit setting a target noise voltage, and a control circuit adjusting at least one of a counting start timing of the counter with respect to a control reference timing, or the criterion level of the reference voltage at the counting start timing, based on a difference between the average noise voltage and the target noise voltage.

10 Claims, 22 Drawing Sheets

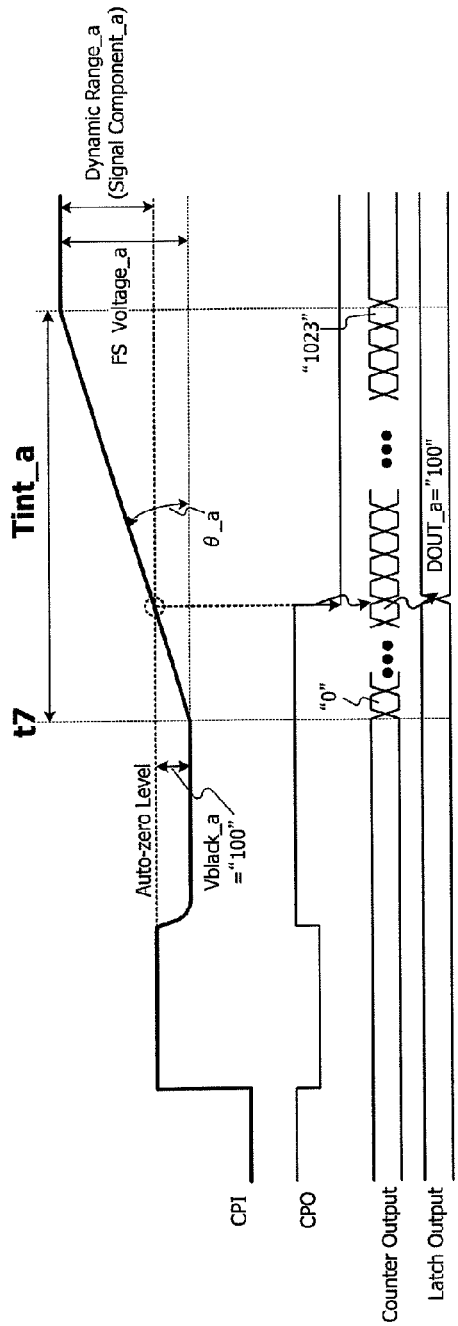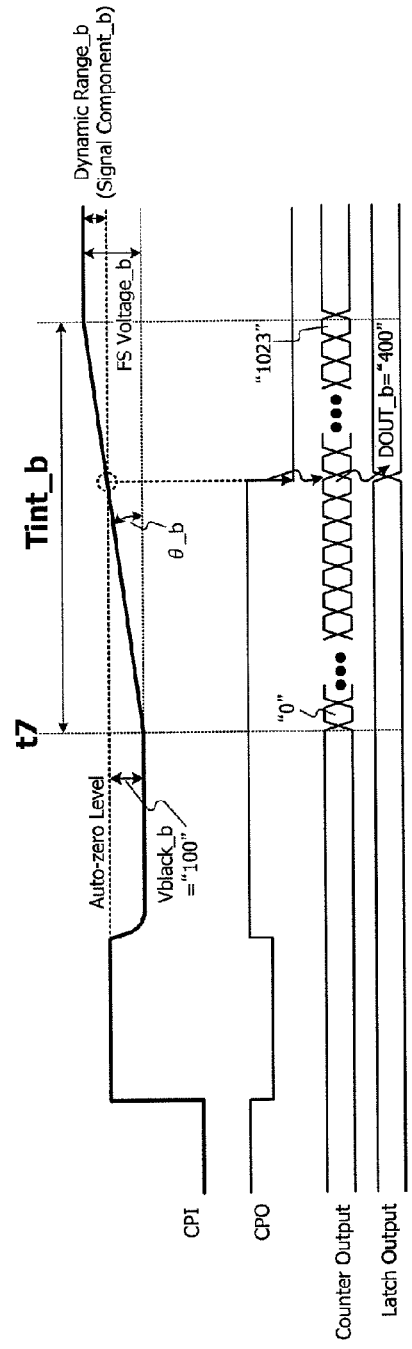
Fig. 7A
Prior Art
Fig. 7B
Prior Art (c) Gain = 4

A/D CONVERTER

CROSS REFERENCE TO RELATED APPLICATION

This Nonprovisional application claims priority under 35 U.S.C. §119(a) on Patent Application No. 2007-018771 filed in Japan on 30 Jan., 2007 the entire contents of which are hereby incorporated by reference.

BACKGROUND OF THE INVENTION

1. Field of the Invention

The present invention relates to an A/D converter and more particularly, to an A/D converter comprising a ramp voltage generation circuit generating a ramp voltage changing its value monotonically for a certain period, a voltage comparison circuit comprising an arithmetic unit sampling and holding an analog voltage to be converted and comparing the sampled and held analog voltage to be converted with a reference voltage given by a voltage change value of the ramp voltage generated from the ramp voltage generation circuit or a voltage value proportional to the voltage change value, and changing the output when the reference voltage equals the analog voltage to be converted, a counter counting a digital value corresponding to the reference voltage and outputting it, and a latch circuit latching the digital value outputted from the counter and outputting it when the output of the voltage comparison circuit is changed.

2. Description of the Related Art

Recently, high speed and low power consumption are increasingly demanded in an A/D converter used in a solid-state image sensor. In order to satisfy the above demand, a column-type A/D converter is used in many cases (refer to Japanese Unexamined Patent Publication No. 2000-286706).

FIG. 1 is a block diagram showing a conventional column-type A/D converter. A column-type A/D converter 10 comprises an A/D conversion unit 11, a ramp voltage source 14 (ramp voltage generation circuit) generating a ramp voltage $V_{RAMP}$, and a counter 15 counting a digital value (n-bit binary signal) corresponding to the voltage change value of the ramp voltage and outputting it. The A/D conversion unit 11 comprises an inverter circuit 12, a switch RS to short-circuit an input node CPI and an output node CPO of the inverter circuit 12, a capacitor CS to sample an analog voltage to be converted, a capacitor CR and a switch S3 to transmit the ramp voltage $V_{RAMP}$ having a value changing monotonically for ascertain period to the input node CPI, a switch SS to sample the analog voltage to be converted, and a latch circuit 13 to latch a counter output corresponding to the analog voltage to be converted as circuit elements. Furthermore, in FIG. 1, a pixel part 16 of a solid-state image sensor and a constant current source Ix connected to a node VIN are also illustrated with the column-type A/D converter 10.

The A/D conversion operation of the column-type A/D converter 10 will be described with reference to an operation timing chart shown in FIG. 2.

At a timing t1, when a switch RX of the pixel part 16 is turned on, a node FD is reset to a voltage $V_{DD}$, the node VIN is charged to a high potential through a MOS transistor MA. In addition, the switch RS is turned on at the same time, and the input node CPI and the output node CPO of the inverter circuit 12 are short-circuited and the input node CPI is automatically reset to an input determination voltage of the inverter circuit 12 (auto-zero level). Although the switch SS is turned on at the same time, switches S3 and TX are in off state.

At a timing t2, when the switch RX is turned off, a reset voltage appears at the node VIN. At a timing t3, when the switch RS is turned off, a reset voltage is sampled in the capacitor CS.

Then, at a timing t4, when the switch TX is turned on, electric charges that are photo-electrically converted by a photoelectric conversion element (photodiode) PD of the pixel part 16 and accumulated are transferred to the node FD, so that the node VIN is shifted to a voltage level (photoelectric conversion level) corresponding to the photo-electrically converted electric charge amount. At a timing t5 after the voltage level of the node VIN has been stabilized, when the switch TX is turned off and the switch S3 is turned on, a voltage difference between the voltage level of the node VIN at that time (photoelectric conversion level) and an initial voltage of the ramp voltage $V_{RAMP}$ is held in the capacitor CR.

Then, at a timing t6, when the switch SS is turned off, a differential value $V_{SIG}$ between the reset voltage (timing t3) and the photoelectric conversion level (timing 6) of the node VIN is held in the input node CPI as the analog voltage to be converted.

At a timing t7, when the voltage value of the ramp voltage $V_{RAMP}$ starts to increase gradually, the voltage of the input node CPI is also increased so as to be proportional to the voltage increase of the ramp voltage $V_{RAMP}$. In addition, at the timing t7, the counter 15 starts to count at the same time.

At a timing t8, when the voltage level of the input node CPI exceeds the input determination voltage of the inverter circuit 12, the inverter circuit 12 inverts the output level of the output node CPO. The latch circuit 13 holds the value of the counter output in response to the output change of the output node CPO.

Here, the differential value $V_{SIG}$ corresponds to an incident light amount to the photoelectric conversion element PD, and the value of the latched counter output is equal to an A/D converted value (digital value) of the differential value $V_{SIG}$. Thus, when the A/D converted value held by the latch circuit 13 is outputted, the column-type A/D converter 10 completes the A/D conversion operation of the analog voltage $V_{SIG}$ to be converted.

FIG. 3 shows input/output characteristics of the inverter circuit 12 that compares the analog voltage $V_{SIG}$ to be converted with an increased voltage value of the ramp voltage $V_{RAMP}$ in the column-type A/D converter 10. The inverter circuit 12 compares the difference voltage between the analog voltage $V_{SIG}$ to be converted and the increased voltage value of the ramp voltage $V_{RAMP}$ as its input voltage with the auto-zero level of the input determination voltage.

The auto-zero level is a voltage level provided by short-circuiting the input and output of the inverter circuit 12, and it is a voltage at an intersection of an input/output characteristic curve A of the inverter and a straight line B provided when an input voltage Vin and an output voltage Vout are equal (Vin=Vout).

When it is assumed that threshold values of a P channel-type MOSFET and an N channel-type MOSFET in the inverter circuit 12 are Vthp and Vthn, respectively and their conductive coefficient are βp and βn, since the current amounts flowing through both MOSFETs of the inverter circuit 12 are equal, the following formula 1 is provided. In addition, in the formula 1, $V_{DD}$ is a power supply voltage supplied to a source terminal of the P channel-type MOSFET, and $V_x$ is an auto-zero level and expressed by a formula 2.

$$\beta n/2 \times (Vx - Vthn)^2 = \beta p/2 \times (V_{DD} - Vx - Vthp)^2 \quad (1)$$

$$Vx = Vin = Vout \quad (2)$$

When the equation of the formula 1 is solved for Vx, the auto-zero level Vx is expressed by the following formula 3.

$$Vx = \{(\beta n/\beta p)^{1/2} \times Vthn + V_{DD} - Vthp\}/(1+(\beta n/\beta p)^{1/2}) \quad (3)$$

FIG. 4 is a schematic block diagram showing a sensor system 100 comprising the above conventional column-type A/D converter. The sensor system 100 comprises a pixel part 16 (sensor unit) of a solid-stage image sensor having a plurality of photoelectric conversion elements in the shape of a matrix, a plurality of A/D conversion units 11 each comprising a voltage comparison circuit 17 and a latch circuit 13 provided with respect to each column of the pixel part 16, a ramp wave generation circuit 14, a counter 15 and a control circuit 18. In addition, the pixel part 16 comprises an effective pixel part 16a and an optical black pixel parts 16b provided at a part of the marginal portions of the pixel part 16 and shielded from light. More specifically, according to the pixel part 16, the optical black pixel part 16b is arranged so as to surround an effective pixel part 16a.

According to the sensor system 100 shown in FIG. 4, the solid-state image sensor such as a CMOS image sensor photo-electrically converts light (incident light) from an object by the photodiode PD shown in FIG. 1 and outputs an analog signal having a current corresponding to the intensity of the light (incident light amount). Here, a noise component called a dark current caused when a pair of electron/hole is generated by heat is superimposed on the analog signal to be converted that is outputted from the photodiode PD in addition to the current corresponding to the intensity of the incident light. Since the signal component provided by the dark current is a noise component, it has to be removed to prevent quality of an image provided from the sensor system 100 from being lowered. Therefore, according to the sensor system 100 shown in FIG. 4, in order to detect the signal component provided by the dark current, the optical black pixel part 16b which is constituted so as to be shielded from light with aluminum and the like and output only the signal component provided by the dark current is provided at a part of the marginal portions of the pixel part 16. In addition, a pixel shielded from light with aluminum and the like is called an optical black pixel (referred to as "OB pixel" occasionally hereinafter) in general.

FIG. 5 is a schematic view showing each OB pixel signal provided from each OB pixel of the optical black pixel part 16b (referred to as "OB part" occasionally hereinafter) and each effective pixel signal provided from each effective pixel of the effective pixel part 16a.

As shown in FIG. 5, a voltage value of the OB pixel signal outputted from the OB part differs among all the OB pixels and the voltage value of the OB pixel signal from each OB pixel shows a random value. An average value of voltage levels of the OB pixel signals provided from the OB pixels is referred to as the OB level (average noise voltage) hereinafter. In addition, as shown in FIG. 5, the effective pixel signal provided from each effective pixel of the effective pixel part 16a is provided by adding a signal component provided by the photoelectric conversion, to the signal component provided by the dark current (OB level). Data to be obtained from the sensor system 100 is the signal component provided by the photoelectric conversion. That is, a voltage level (signal component 51) provided by subtracting the OB level from the voltage level of the effective pixel signal provided from the effective pixel part 16a is to be obtained.

Meanwhile, when an incident light amount from an object is small such as when a night view is taken by the sensor system 100, the value of the voltage level of the signal component 51 is very small. Therefore, according to a CMOS image sensor, in order to provide an image having high contrast, multiplying the signal component 51 by gain extends an A/D converted result. According to the column-type A/D converter (FIG. 1) of the sensor system 100 shown in FIG. 4, gain to the input signal (analog voltage to be converted) can be changed by changing inclination of the voltage change of the ramp voltage $V_{RAMP}$. Here, FIG. 6 shows a relation between a voltage waveform of the node CPI and an operation timing and an output value (A/D converted result) of the latch circuit 13 when the inclination of the voltage change of the ramp voltage $V_{RAMP}$ is set to inclined angles θ1 to θ3 (each of the inclined angles θ1 to θ3 is not defined as a geometric angle but defined as an amount of voltage change per unit time). As shown in FIG. 6, when the inclination of the voltage change of the ramp voltage $V_{RAMP}$ is changed to the inclined angles θ1 to θ3, the timing at which the voltage level of the node CPI exceeds the auto-zero level (threshold voltage of the inverter circuit 12) is changed. The latch circuit 13 latches the digital value outputted from the counter 15 when the output of the inverter circuit 12 is changed. Therefore, when the timing at which the voltage level of the node CPI exceeds the auto-zero level is changed, the digital value of the counter 15 latched by the latch circuit 13 is changed. More specifically, when the inclination of the voltage change of the ramp voltage $V_{RAMP}$ is set to the inclined angle θ1, the inclined angle θ2, and the inclined angle θ3, data D3, D2, and D1 are outputted as A/D converted result, respectively. Thus, the A/D converted result (output value of the latch circuit 13) is changed in accordance with the voltage change of the ramp voltage $V_{RAMP}$. That is, the gain can be set to the analog voltage to be converted that is inputted to the column-type A/D converter 10 shown in FIG. 1 by changing the inclination of the voltage change of the ramp voltage $V_{RAMP}$.

Here, in the A/D converter, a FS voltage (full scale voltage) is a voltage that defines a range of an input voltage (analog voltage to be converted) that can be converted to the digital value, and the smaller the value of the FS voltage is, the smaller the range of the input voltage that can be measured (that is, dynamic range) is. According to the A/D converter 10 used in the CMOS image sensor and the like, it is desirable that the dynamic range of the signal component 51 provided by the photoelectric conversion is large in order to improve image quality and the like.

Meanwhile, according to the conventional A/D converter 10 shown in FIG. 1, the full scale voltage is assigned to both signal component provided by photoelectric conversion and noise component provided by the dark current. Here, in FIG. 6, references FS3 to FS1 designate the full scale voltages assigned to the signal component 51 provided by photoelectric conversion and the noise component provided by the dark current shown in FIG. 5. Furthermore, according to the A/D converter 10 shown in FIG. 1, the analog voltage to be converted on which the noise component is superimposed is multiplied by the gain. That is, the noise component is multiplied by the gain and as a result, the OB level is increased. Therefore, when the inclination of the voltage change of the ramp voltage $V_{RAMP}$ is controlled so as to be decreased in order to increase the gain in the A/D converter 10 shown in FIG. 1, the ratio of the full scale voltage assigned to the noise component becomes high. Therefore, as shown in FIG. 6, when the inclination of the voltage change of the ramp voltage $V_{RAMP}$ is degreased to the inclined angle θ3 to θ1 to increase the gain on the input signal of the A/D converter, the FS voltage that can be assigned to the signal component 51 provided by the photoelectric conversion is decreased so as to be proportional to the decreases of the FS3 to FS1 in accordance with the decrease of the inclination θ. That is, the problem is that the range of the input voltage that can be measured by the A/D converter (dynamic range) becomes small in accordance with the increase of the gain.

In addition, when only the signal component 51 provided by the photoelectric conversion can be multiplied by the gain, the full scale voltage of the signal component provided by the photoelectric conversion can be increased and the dynamic range of the signal component 51 can be increased. However, according to the conventional A/D converter shown in FIG. 1, not only the signal component 51 provided by the photoelectric conversion but also the OB level shown in FIG. 5 is multiplied by the gain. Thus, when the input signal (analog voltage to be converted) is multiplied by the gain, the problem is that the ratio of the full scale voltage to the signal component 51 provided by photoelectric conversion is decreased, and the dynamic range of the signal component 51 provided by the photoelectric conversion is decreased.

In order to illustrate the above problem, FIG. 7 shows a timing chart of a column-type A/D converter having 10-bit precision. FIG. 7A shows a relation between a voltage waveform of the node CPI, and an operation timing and an output value (A/D converted result) of the latch circuit 13 when gain is 1, and FIG. 7B shows a relation between a voltage waveform of the node CPI, and an operation timing and an output value (A/D converted result) of the latch circuit 13 when gain is 4. According to the column-type A/D converter shown in FIG. 7, it is assumed that a 10-bit counter is used, and an analog voltage is converted to a digital value of "0 $(=2^0)$" to "1023 $(=2^{10}-1)$" LSB. Thus, the dynamic range of the column-type A/D converter shown in FIG. 7 is 1024 levels.

A voltage level Vblack_a of an OB pixel signal from an OB part 16b in FIG. 7A is equal to a voltage level Vblack_b of an OB pixel signal from an OB part 16b in FIG. 7B, and expressed by the following formula 4.

$$V\text{black}\_a = V\text{black}\_b = \text{"100"} LSB(\text{dec}) \quad (4)$$

Here, since the gain is set to 1 in FIG. 7A and the gain is set to 4 in FIG. 7B, a relation between an inclination θ_a of the voltage change of the ramp voltage $V_{RAMP}$ in the case of FIG. 7A and an inclination θ_b of the voltage change of the ramp voltage $V_{ramp}$ in the case of FIG. 7B is expressed by the following formula 5 when it is assumed that each inclination is defined not as a geometric angle but as an amount of voltage change per unit time.

$$\theta\_b = \theta\_a/4 \quad (5)$$

Therefore, an A/D converted result DOUT_a of the voltage level Vblack_a of the OB pixel signal in the case where the gain is set to 1 is provided such that DOUT_a=100 (decimal number) according to FIG. 7A. Similarly, an A/D converted result DOUT_b of the voltage level Vblack_b of the OB pixel signal in the case where the gain is set to 4 is provided such that DOUT_b=400 (decimal number) according to FIG. 7B.

Therefore, the dynamic range of 100 is assigned to the noise component and the rest of 923 (=1023−100) is assigned to the signal component provided by the photoelectric conversion when the gain is set to 1 as shown in FIG. 7A. Similarly, the dynamic range of 400 is assigned to the noise component and the rest of 623 (=1023−400) is assigned to the signal component provided by the photoelectric conversion when the gain is set to 4 as shown in FIG. 7B. That is, when the gain is set to 4, the dynamic range for the signal component provided by the photoelectric conversion is 623 that is less than 923 when the gain is set to 1.

Thus, when gain on an inputted analog voltage to be converted is changed by changing inclination of a voltage waveform of a ramp voltage in a single slope-type A/D converter used in a CMOS image sensor and the like, an A/D converter capable of preventing a dynamic range assigned to a signal component provided by photoelectric conversion from being decreased because an OB level (optical black level) contained in an analog voltage to be converted is multiplied by the gain is demanded.

SUMMARY OF THE INVENTION

The present invention was made in view of the above problems and it is an object of the present invention to provide an A/D converter capable of preventing a dynamic range of a signal component provided by photoelectric conversion from being narrowed when gain of an inputted analog voltage to be converted is increased to improve image quality. In addition, it is another object of the present invention to provide a sensor system comprising the above A/D converter and capable of preventing a dynamic range of a signal component provided by photoelectric conversion from being narrowed when gain of an inputted analog voltage to be converted is increased to improve image quality.

An A/D converter according to the present invention to attain the above object comprises a ramp voltage generation circuit generating a ramp voltage having a voltage value changing monotonically for a certain period, a voltage comparison circuit comprising an arithmetic unit sampling and holding an analog voltage to be converted and comparing the sampled and held analog voltage to be converted, with a reference voltage given by a voltage change value of the ramp voltage generated from the ramp voltage generation circuit or a voltage value proportional to the voltage change value, and changing an output when the reference voltage equals the analog voltage to be converted, a counter counting a digital value corresponding to the reference voltage and outputting the digital value, and a latch circuit latching the digital value outputted from the counter when the output of the voltage comparison circuit is changed and outputting the digital value, and it is characterized by comprising an averaging process circuit averaging a noise component contained in the analog voltage to be converted to obtain an average noise voltage, a target noise voltage setting circuit setting a target noise voltage as a target value of the average noise voltage, and a control circuit performing at least one adjustment of a counting start timing of the counter with respect to a control reference timing at which the reference voltage starts to change from a criterion level by the ramp voltage generation circuit, or adjustment of the criterion level of the reference voltage at the counting start timing of the counter, based on a difference between the average noise voltage and the target noise voltage, as first characteristics.

The A/D converter having the above characteristics in the present invention is characterized in that the control circuit calculates an index value showing the difference between the average noise voltage and the target noise voltage, calculates a counter standby time to adjust the counting start timing of the counter in accordance with the index value, and adjusts the counting start timing of the counter in accordance with the counter standby time, as second characteristics.

The A/D converter having the first characteristics according to the present invention is characterized in that the control circuit calculates an index value showing the difference between the average noise voltage and the target noise voltage, calculates a counter standby time to adjust the counting start timing of the counter in accordance with the index value, delays the counting start timing with respect to the control reference timing in accordance with the counter standby time when the average noise voltage is above the target noise voltage, or hastens the counting start timing with respect to the control reference timing in accordance with the counter standby time when the average noise voltage is below the target noise voltage, and further calculates an adjustment amount of the criterion level of the reference voltage at the control reference timing based on the index value and changes the criterion level of the reference voltage by the adjustment amount in the direction opposite to the voltage change direction of the ramp voltage before the control reference timing, as third characteristics.

The A/D converter having the first characteristics according to the present invention is characterized in that the control circuit calculates an index value showing the difference between the average noise voltage and the target noise voltage, calculates an adjustment amount of the criterion level of the reference voltage at the counting start timing based on the index value and changes the criterion level of the reference voltage based on the adjustment amount in the voltage change direction of the ramp voltage before the counting start timing, as fourth characteristics.

The A/D converter having the above characteristics according to the present invention is characterized in that when the average noise voltage is below the target noise voltage, the control circuit calculates an adjustment amount of the criterion level of the reference voltage at the counting start timing based on the index value and changes the criterion level of the reference voltage based on the adjustment amount in the direction opposite to the voltage change direction of the ramp voltage before the counting start timing, as fifth characteristics.

The A/D converter having any one of the above characteristics according to the present invention is characterized in that the ramp voltage generation circuit comprises a first current mirror circuit and a second current mirror circuit that duplicate a current value from a constant current source, an integral capacity charged by a current duplicated by the first current mirror circuit and discharged by a current duplicated by the second current mirror circuit, and a switch circuit alternatively switching between charging the integral capacity by the first current mirror circuit and discharging the integral capacity by the second current mirror circuit, as sixth characteristics.

The A/D converter having any one of the above characteristics according to the present invention is characterized in that the arithmetic unit comprises an inverter circuit, and a voltage synthetic circuit generating a composite voltage as an input voltage of the inverter circuit provided by adding a difference voltage between the analog voltage to be converted and the reference voltage, to an input determination voltage of the inverter circuit, as seventh characteristics.

The A/D converter having the first to sixth characteristics according to the present invention is characterized in that the arithmetic unit comprises a differential input type of operation amplifier receiving the analog voltage to be converted and the ramp voltage as input voltages, as eighth characteristics.

The A/D converter having any one of the above characteristics according to the present invention is characterized in that the control circuit inversely operates the ramp voltage generation circuit when the criterion level of the reference voltage is changed in the direction opposite to the voltage change direction of the ramp voltage, as ninth characteristics.

A sensor system according to the present invention to attain the above object comprises a sensor having a plurality of photoelectric conversion elements arranged in the shape of a matrix, a plurality of A/D conversion units each provided in each column of the sensor and comprising the voltage comparison circuit and the latch circuit of the A/D converter having any one of the above characteristics according to the present invention, the ramp voltage generation circuit and the counter of the A/D converter, the averaging process circuit, the target noise voltage setting circuit, and the control circuit, and it is characterized in that an optical black pixel part shielded from light is provided at a part of the marginal portions of the sensor, and the averaging process circuit averages A/D converted values of the A/D conversion unit from an output signal of the optical black pixel part to get the average noise voltage, as first characteristics.

In addition, according to the A/D converter having the above characteristics, it is assumed that the monotonic change of the ramp voltage of the ramp voltage generation circuit is such that the voltage waveform of the ramp voltage is the combination of an increasing waveform and a non-changing waveform or the combination of a decreasing waveform and a non-changing waveform after the control reference timing at which the reference voltage starts changing from the criterion level by the ramp voltage generation circuit.

According to the A/D converter having the above characteristics, since at least the adjustment of the counting start timing of the counter with respect to the control reference timing or the adjustment of the criterion level of the reference voltage at the counting start timing of the counter is performed based on the difference between the average noise voltage and the target noise voltage, the A/D converted result of the average noise voltage can follow the digital value corresponding to the target noise voltage, so that the dynamic range can be largely ensured without depending on the set value of the gain.

More specifically, according to the A/D converter having the above characteristics, the average noise voltage provided by averaging the A/D converted results from the analog signal from all the OB pixel contained in the OB part (noise component) is negatively fed back so as to follow the voltage level of the target noise voltage as the target value of the average noise voltage (OB level). That is, since the OB level that is the noise component follows the voltage level of the target noise voltage with respect to the limited full scale voltage (FS voltage) of the A/D converter, the more full scale voltage can be assigned to the signal component provided by photoelectric conversion by setting the target noise voltage to a small value especially. Therefore, the A/D converter having the above characteristics is especially effective in a case where it is necessary to multiply the photo-electrically converted signal having a small amount of incident light by the gain such as a case where a dark object such as a night view is taken. In this case, according to the A/D converter having the above characteristics, even when the set value of the gain is increased and the average noise voltage multiplied by the gain is increased, since the full scale voltage assigned to the signal component provided by the photoelectric conversion is not reduced so much, a preferable image can be maintained.

In addition, according to the sensor system to which the present invention is applied, since the A/D converter having the above characteristics is used, the effect of the A/D converter having the above characteristics can be entirely provided, so that the dynamic range for the signal component provided by the photoelectric conversion can be prevented from being decreased and the image quality can be prevented from deteriorating.

BRIEF DESCRIPTION OF THE DRAWINGS

FIG. 7 is a timing chart showing a dynamic range when a set value of gain is changed in the A/D converter according to the conventional art;

DESCRIPTION OF THE PREFERRED EMBODIMENTS

Embodiments of an A/D converter and sensor system according to the present invention will be described with reference to the drawings hereinafter.

First Embodiment

A first embodiment of an A/D converter according to the present invention and a sensor system comprising the A/D converter will be described with reference to FIGS. 8 and 9.

First, a sensor system according to this embodiment will be described with reference to FIG. 8.

Figure 8:
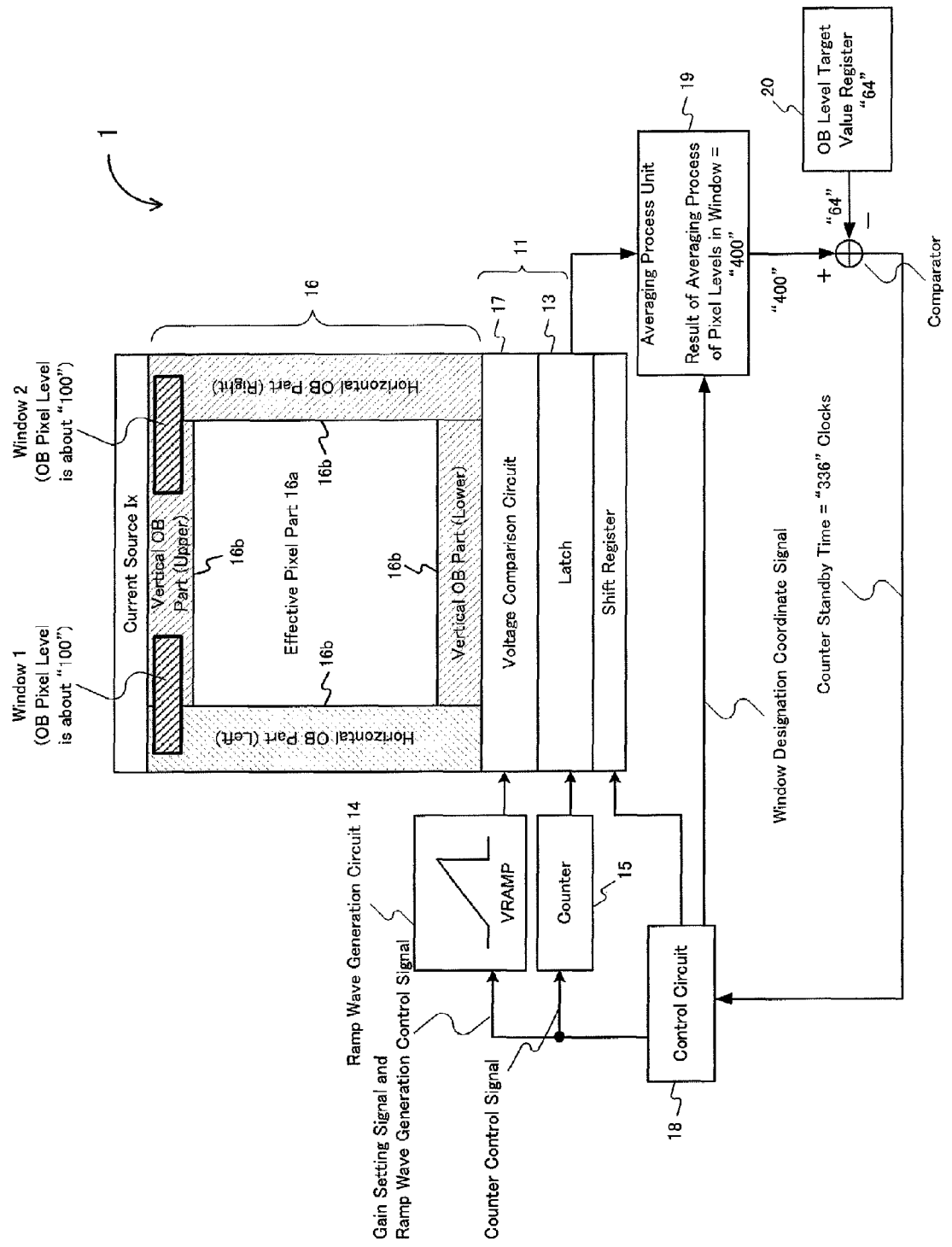
FIG. 8 is a schematic block diagram showing a schematic constitution of a sensor system comprising an A/D converter according to the present invention in a first embodiment.

As shown in FIG. 8, a sensor system 1 comprises a pixel part (sensor unit) 16 in which a plurality of photoelectric conversion elements are arranged in the shape of a matrix, and components of the A/D converter according to the present invention. The pixel part 16 comprises an effective pixel part 16a, and an optical black pixel part (OB part) 16b provided at a part of the marginal portions of the pixel part 16. The OB part 16b is shielded from light and outputs only an analog voltage provided by a dark current, to be converted, that is, an analog voltage to be converted containing a noise component.

Figure 1:
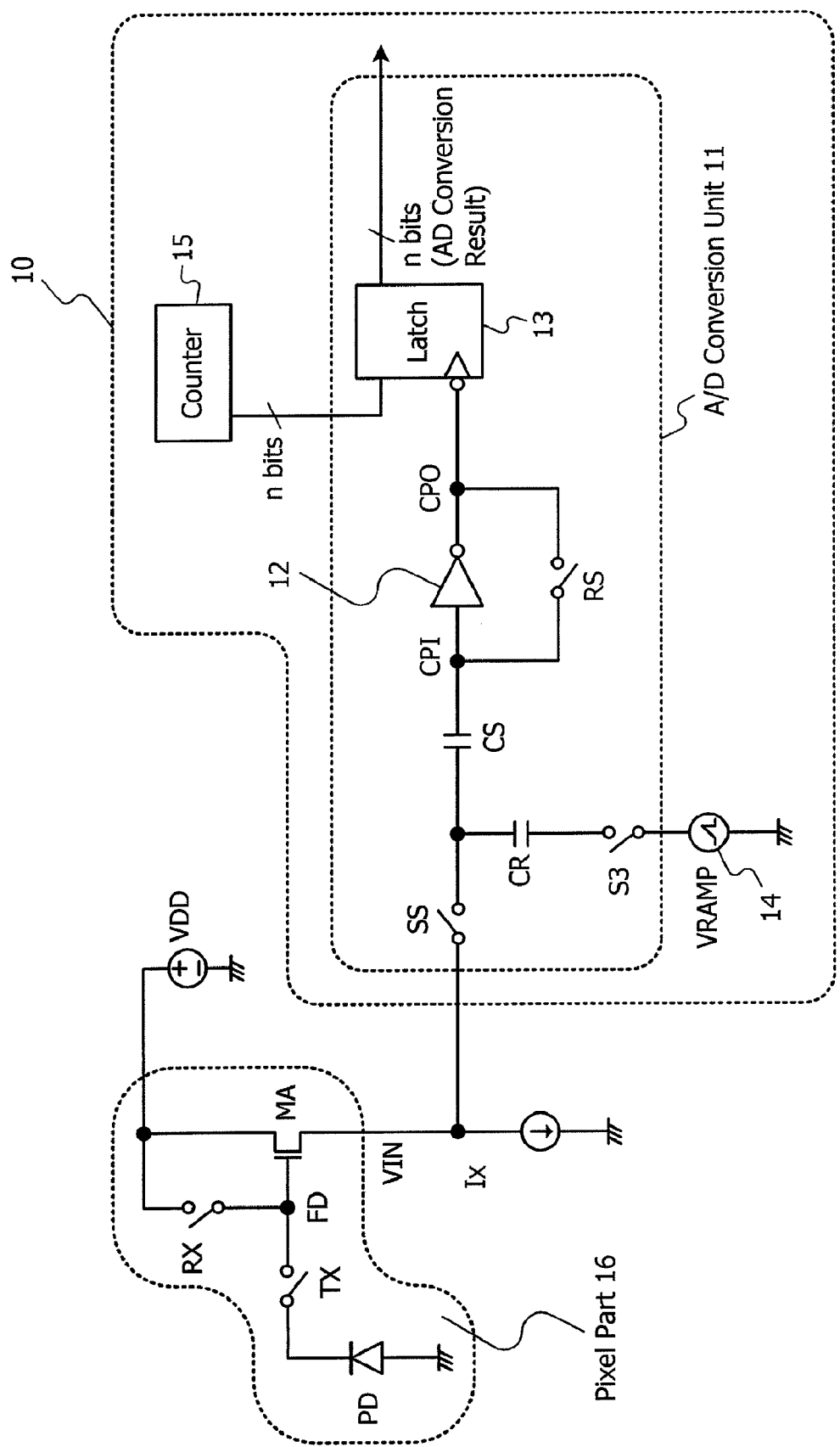
FIG. 1 is a schematic block diagram showing a schematic constitution of a column-type A/D converter and a solid-state image sensor according to a conventional art.
Figure 2:
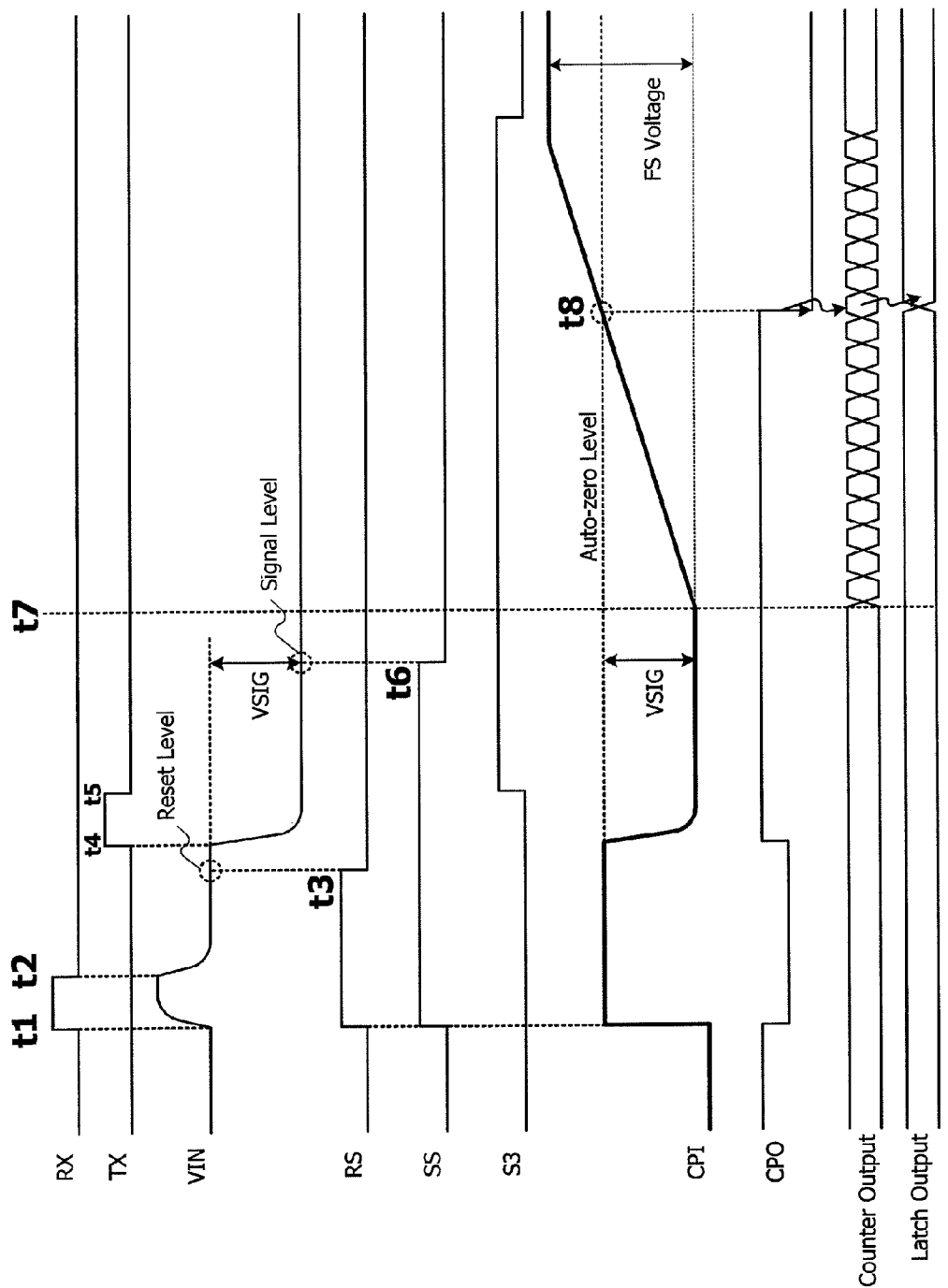
FIG. 2 is a waveform diagram showing a schematic signal waveform at each node of the column-type A/D converter and the solid-state image sensor shown in FIG. 1.
Figure 3:
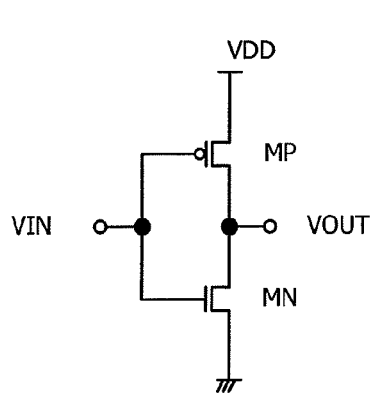
FIG. 3 is an explanatory view showing a constitution and input/output characteristics of an inverter circuit of the column-type A/D converter shown in FIG. 1.
Figure 3:
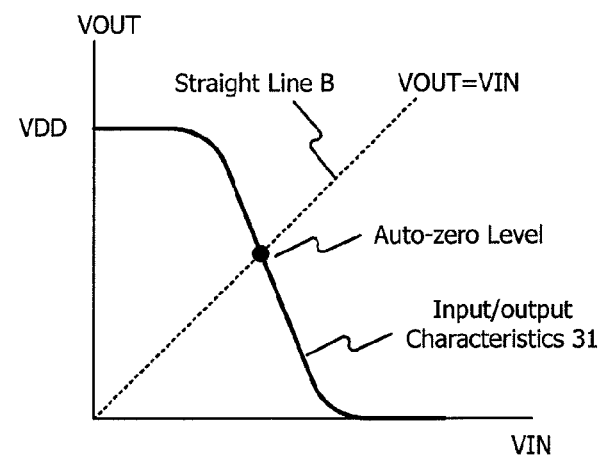
Figure 4:
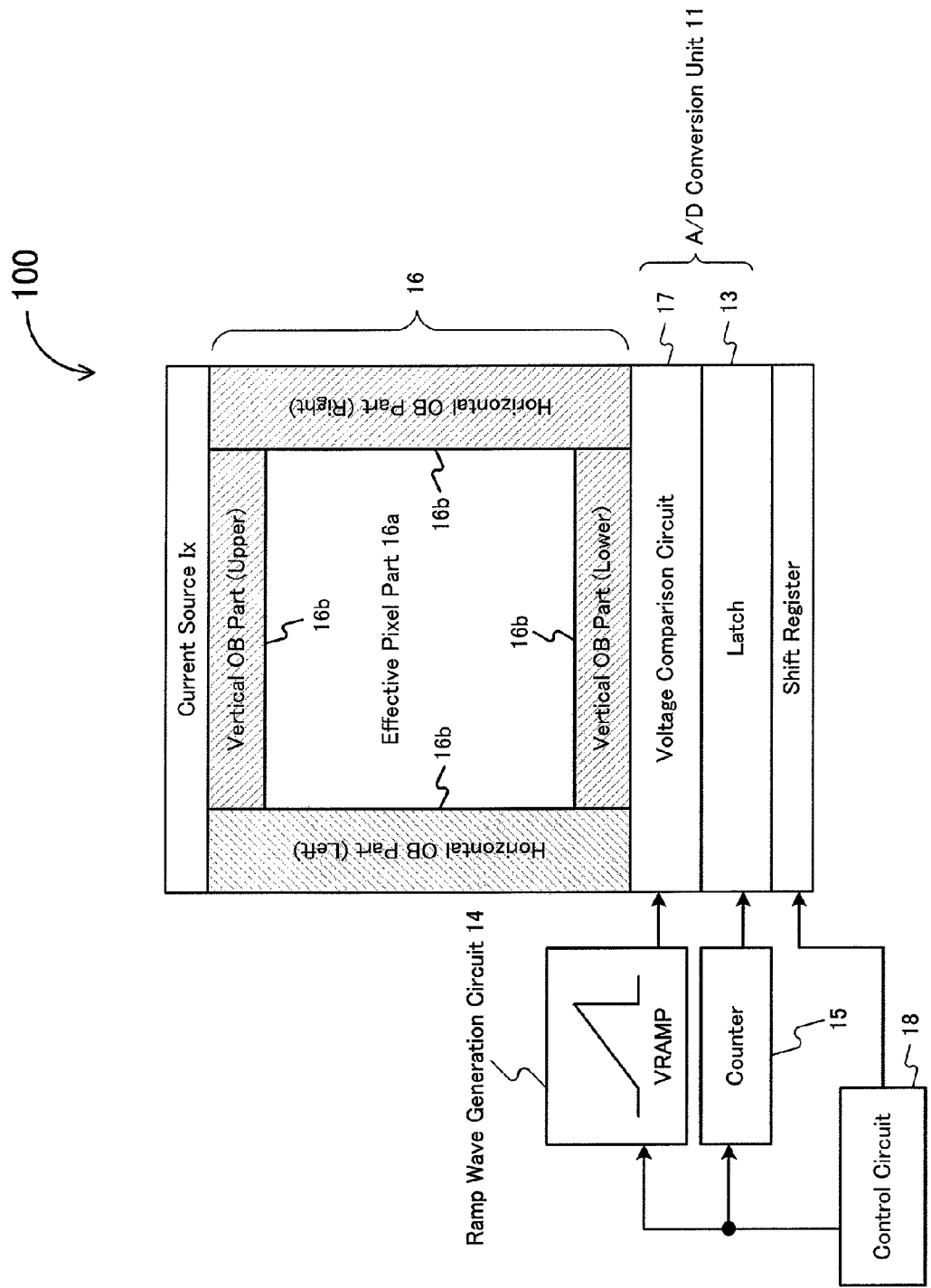
FIG. 4 is a schematic block diagram showing a schematic constitution of a sensor system comprising the column-type A/D converter according to the conventional art.
Figure 5:
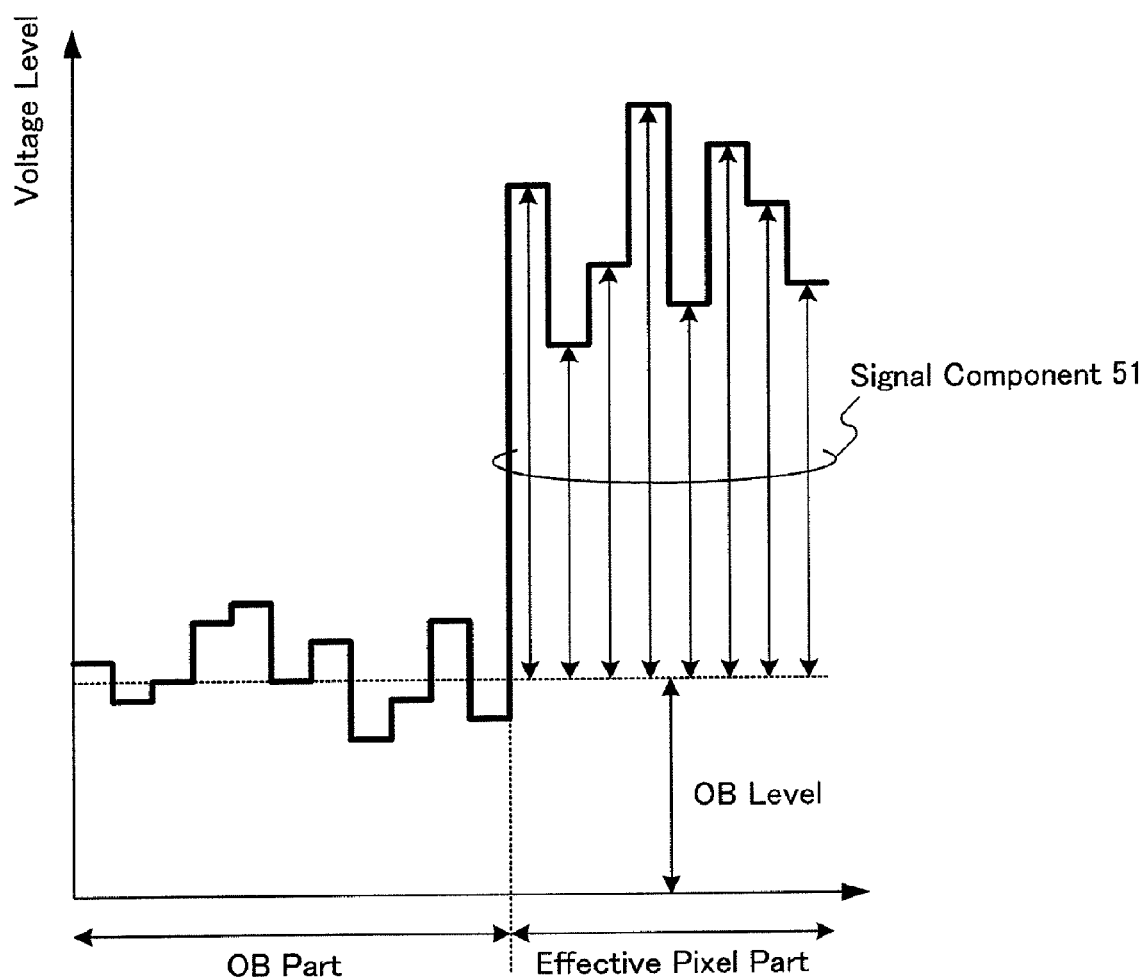
FIG. 5 is a waveform diagram showing a digital signal converted from an analog voltage outputted from each of an effective pixel part and an optical black pixel part of a sensor in the A/D converter according to the conventional art.
Figure 6:
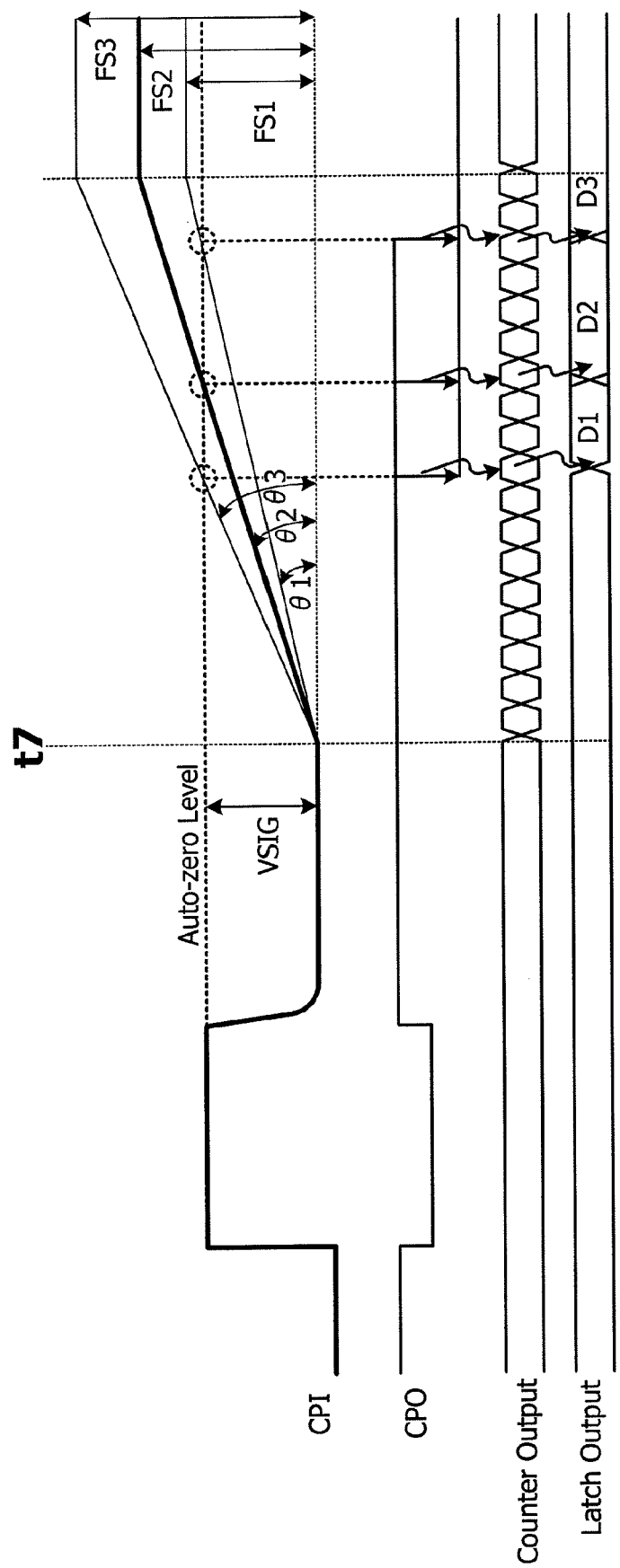
FIG. 6 is a timing chart showing an output timing and an output value of an A/D converted result when inclination of a voltage change of a ramp voltage is changed in the A/D converter according to the conventional art.

The A/D converter comprises, as its basic constitution, a ramp wave generation circuit (ramp voltage generation circuit) 14 generating a ramp voltage changing its value monotonically for a certain period, a voltage comparison circuit 17 comprising an arithmetic unit for sampling and holding the analog voltage to be converted and comparing the sampled and held analog voltage to be converted with a reference voltage given by a voltage change value of the ramp voltage generated from the ramp wave generation circuit 14 or a voltage value proportional to the voltage change value, and changing an output when the reference voltage equals the analog voltage to be converted, a counter 15 counting a digital value corresponding to the reference voltage and outputting it, and a latch circuit 13 latching the digital value outputted from the counter 15 when the output of the voltage comparison circuit 17 is changed and outputting it. In addition, the constitutions of an A/D conversion unit 11 comprising the ramp wave generation circuit 14, the voltage comparison circuit 17 and the latch circuit 13, and the counter 15 are the same as those of the conventional A/D converter shown in FIG. 1. The counter 15 according to this embodiment is a 10-bit counter that is constituted so as to output a digital value of "$0(=2^0)$" to "$1023(=2^{10}-1)$" LSB.

The A/D converter according to this embodiment further comprises an averaging process unit (averaging process circuit) 19 averaging noise components contained in the analog voltage to be converted to obtain an average noise voltage, a target noise voltage setting circuit 20 setting a target noise voltage as a target value of an average noise voltage, and a control circuit 18 adjusting at least one of a counting start timing of the counter 15 with respect to a control reference timing at which the reference voltage starts to change from a criterion level by the ramp wave generation circuit 14, or the criterion level of the reference voltage at the counting start timing of the counter 15, based on a difference between the average noise voltage and the target noise voltage.

The averaging process unit 19 gets an A/D converted result (digital values) provided by A/D converting the analog voltage outputted from the OB part 16b (a vertical OB part or horizontal OB part) by the A/D conversion unit 11, averages them and derives a voltage level (OB level) of the average noise voltage (digital value). Since the voltage level of the analog voltage to be converted that is outputted from each OB pixel constituting the OB part 16b shows a random value, the averaging process unit 19 averages it and detects the OB level.

The target noise voltage setting circuit 20 comprises a register storing a voltage level value of the target noise voltage, which is set to "64" LSB in this embodiment.

Next, an operation of the sensor system 1 of this embodiment will be described with reference to FIGS. 8 and 9. Here, a description will be made assuming that gain on the input signal of the A/D converter is set to 4.

The control circuit 18 shown in FIG. 8 outputs a window designation coordinate signal to specify a region of an OB pixel to be used in calculating the OB level (referred to as "window" occasionally hereinafter) in the OB part 16b, to the averaging process unit 19. Here, the control circuit 18 outputs the window designation coordinate signal to specify a window 1 and a window 2 shown in FIG. 8, to the averaging process unit 19. In addition, the control circuit 18 outputs a gain setting signal to set the value of the gain to 4, to the ramp wave generation circuit 14.

Then, the averaging process unit 19 gets A/D converted data provided by A/D converting a voltage level of each OB pixel contained in the window 1 and the window 2, from the A/D conversion unit 11. In addition, here, a description will be made assuming that the A/D converted data provided by A/D converting the voltage level of each OB pixel in the window 1 and the window 2 is about "100" LSB (dec). The averaging process unit 19 adds a value ($\approx$"100" LSB) of the AID converted data of each OB pixel for all the OB pixels and finds an additional value of the A/D converted data. The averaging process unit 19 calculates the averaged value (OB level) by dividing the additional value of the A/D converted data by the number of the OB pixels contained in the window 1 and the window 2. Here, since the gain value is set to "4" and the value of the A/D converted data for each OB pixel contained in the window 1 and the window 2 is about "100" LSB, the value of the A/D converted data taken in the averaging process unit 19 is about "400" LSB. Therefore, in this case, the OB level is "400" LSB.

The control circuit 18 gets "336" (="400"−"64") LSB from a comparator that subtracts a value "64" LSB of the target noise voltage outputted from the target noise voltage setting circuit 20, from the value "400" LSB of the OB level outputted from the averaging process unit 19. Then, the control circuit 18 calculates a counter standby time to adjust the counting start timing of the counter 15 in accordance with the output value from the comparator (here, "336" LSB (dec), which is an index value showing the difference between the average noise voltage and a target noise voltage). According to this embodiment, since the counter 15 is constituted so as to add the output value one by one in synchronization with a clock of the sensor system 1, a counter standby time Tcw_c (clock number) is calculated by the following formula 6 using an OB level (average noise voltage) Vblack and a target noise voltage Nsp.

$$Tcw\_c = V\text{black} - Nsp \tag{6}$$

The control circuit 18 stores the counter standby time Tcw_c calculated by the formula 6, that is, "336" LSB here. Furthermore, the control circuit 18 delays a counting start time of the counter 15 based on the stored counter standby time Tcw_c when the analog voltage is A/D converted.

Figure 9:
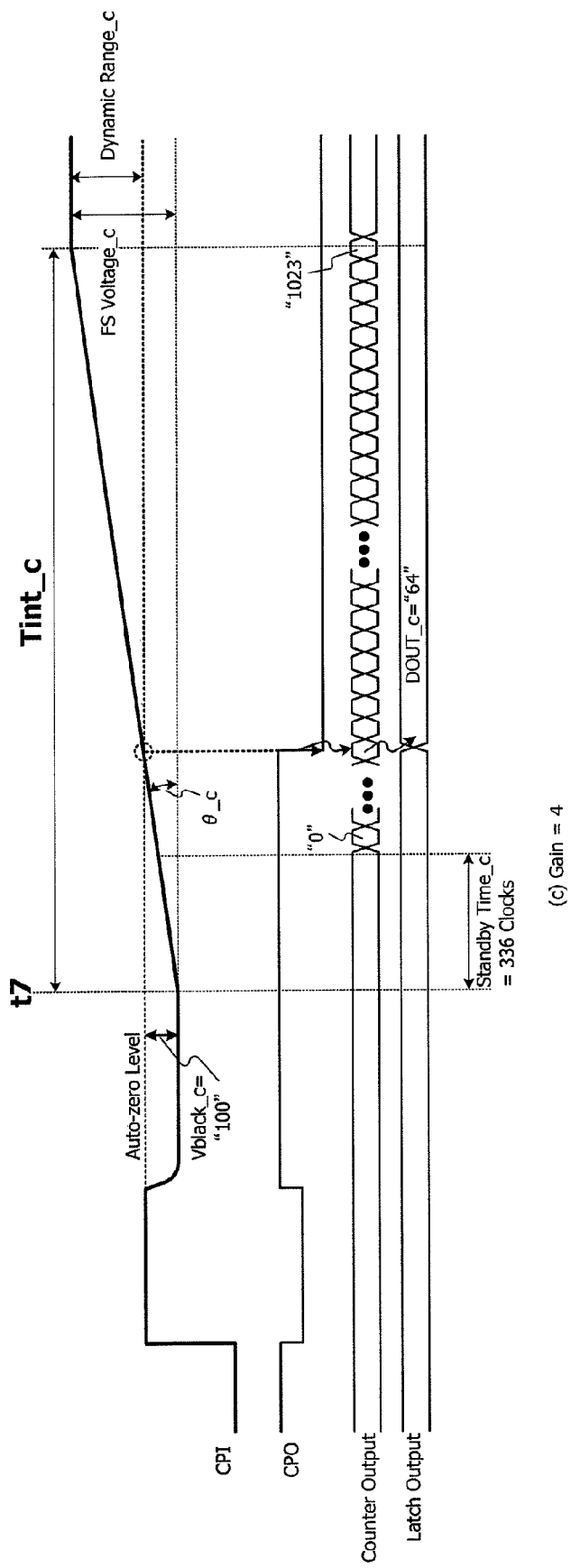
FIG. 9 is a timing chart showing a voltage waveform of each of an input node (node CPI) of an arithmetic unit, a counter output and an A/D converted result of the sensor system comprising the A/D converter according to the present invention in the first embodiment.

FIG. 9 shows voltage waveforms of the input node (node CPI) of the voltage comparison circuit 17, the output of the counter 15, and the output of the latch circuit 13 (A/D converted result). More specifically, as shown in FIG. 9, the control circuit 18 delays the counting start time of the counter 15 by the counter standby time Tcw_c (="336" clocks) calculated by the above process, from a time t7 that is the counting start time of the counter 15 when the OB level Vblack is equal to the target noise voltage Nsp.

In addition, when an inclination θ_c of a voltage change of a ramp voltage $V_{RAMP}$ outputted from the ramp wave generation circuit 14 is defined not by a geometric angle but by a voltage change per unit time in FIG. 9, it has a relation with an inclination θ_a and an inclination θ_b shown in FIG. 7 in the following formula 7.

$$\theta\_c = \theta\_b = \theta\_a/4 \tag{7}$$

Therefore, as shown in FIG. 9, when it is assumed that a value Vblack_c of the A/D converted data with respect to each OB pixel is "100" LSB, an A/D converted result DOUT_c that is the output value of the latch circuit 13 is "64" LSB. This is equal to the set value of the target noise voltage. Therefore, according to the present invention, when the counter standby time is set regardless of the set value of the gain and the counting start timing of the counter 15 is adjusted with respect to the control reference timing t7 when the reference voltage starts to change from the criterion level by the ramp wave generation circuit 14, the OB level can be set to the target noise voltage virtually. In this case, a dynamic range of a signal component provided by photoelectric conversion is "1023"−"64"="959" LSB. That is, when the gain is set to 4, while the dynamic range of the signal component provided by the photoelectric conversion is "632" LSB in the conventional A/D converter shown in FIG. 7B, it is "959" LSB in the A/D converter according to the present invention. Thus, it can be understood that a sufficiently large dynamic range is ensured.

In addition, an operation time Tint_c of the ramp wave generation circuit 14 shown in FIG. 8 is calculated by the following formula 8 using the counter standby time Tcw_c, and a time taken for the counter 15 to count from an initial value (here, "0" LSB) to a maximum value (here, "1023" LSB), that is, a counter clock number Int_c.

$$Tint\_c = Tcw\_c + Int\_c \tag{8}$$

According to this embodiment, since the counter standby time Tcw_c is "336" clocks and the counter clock number Int_c is $2^N$ (N is the number of bits of the counter 15, that is, "10" here), the operation time Tint_c of the ramp wave generation circuit 14 becomes 336+1024=1360 (clocks). In addition, the operation time Tint_c of the ramp wave generation circuit 14 is set by the control circuit 18.

Second Embodiment

A second embodiment of an A/D converter according to the present invention and a sensor system comprising the A/D converter will be described with reference to FIGS. 10 to 15. According to this embodiment, a description will be made of a case where control differs between cases where the OB levels (average noise voltage) are above and below the target noise voltage.

Figure 14:
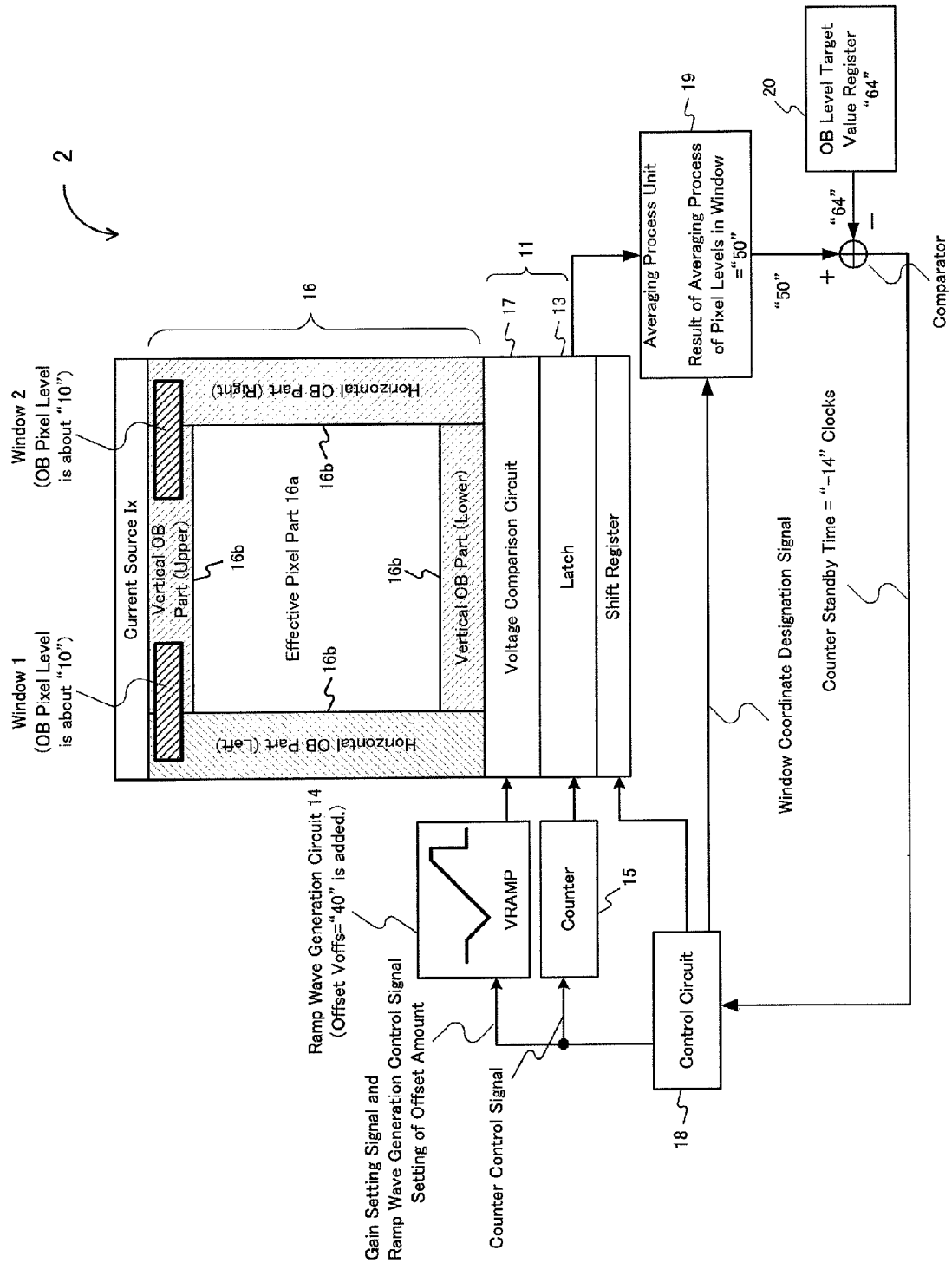
FIG. 14 is a schematic block diagram showing a schematic constitution of the sensor system comprising the A/D converter according to the present invention in the second embodiment.

First, constitutions of an A/D converter and a sensor system according to this embodiment will be described. FIG. 14 shows a schematic constitution of the sensor system 2 according to this embodiment. In addition, the basic constitutions of the A/D converter and the sensor system 2 in this embodiment are the same as those in the A/D converter and the sensor system in the first embodiment.

A control circuit 18 according to this embodiment calculates an index value showing a difference between an OB level (average noise voltage) and a target noise voltage, and calculates a counter standby time to adjust a counting start timing of a counter 15 in accordance with the index value, and delays the counting start timing with respect to a control reference timing according to the counter standby time when the OB level is above the target noise voltage. In addition, the control circuit 18 hastens the counting start timing with respect to the control reference timing according to the counter standby time when the OB level is below the target noise voltage, and calculates an adjustment amount of the criterion level of the reference voltage at the control reference timing based on the index value, and changes the criterion level of the reference voltage by the adjustment amount in a direction opposite to the voltage change direction of the ramp voltage before the control reference timing.

An operation of the sensor system 1 in this embodiment will be described with reference to FIGS. 8 to 14. Here, a description will be made assuming that gain on an input signal of the A/D converter is set to 4 similar to the first embodiment.

In addition, when the OB level (average noise voltage) is above the target noise voltage, the same controls as those in the first embodiment is made, that is, the control circuit 18 calculates the counter standby time Tcw_c based on the index value showing the difference between the OB level (average noise voltage) and the target noise voltage and delays the counting start timing with respect to the control reference timing t7 in accordance with the counter standby time Tcw_c.

A description will be made of control when the OB level (average noise voltage) is below the target noise voltage with reference to FIGS. 10 to 15, hereinafter.

Figure 10:
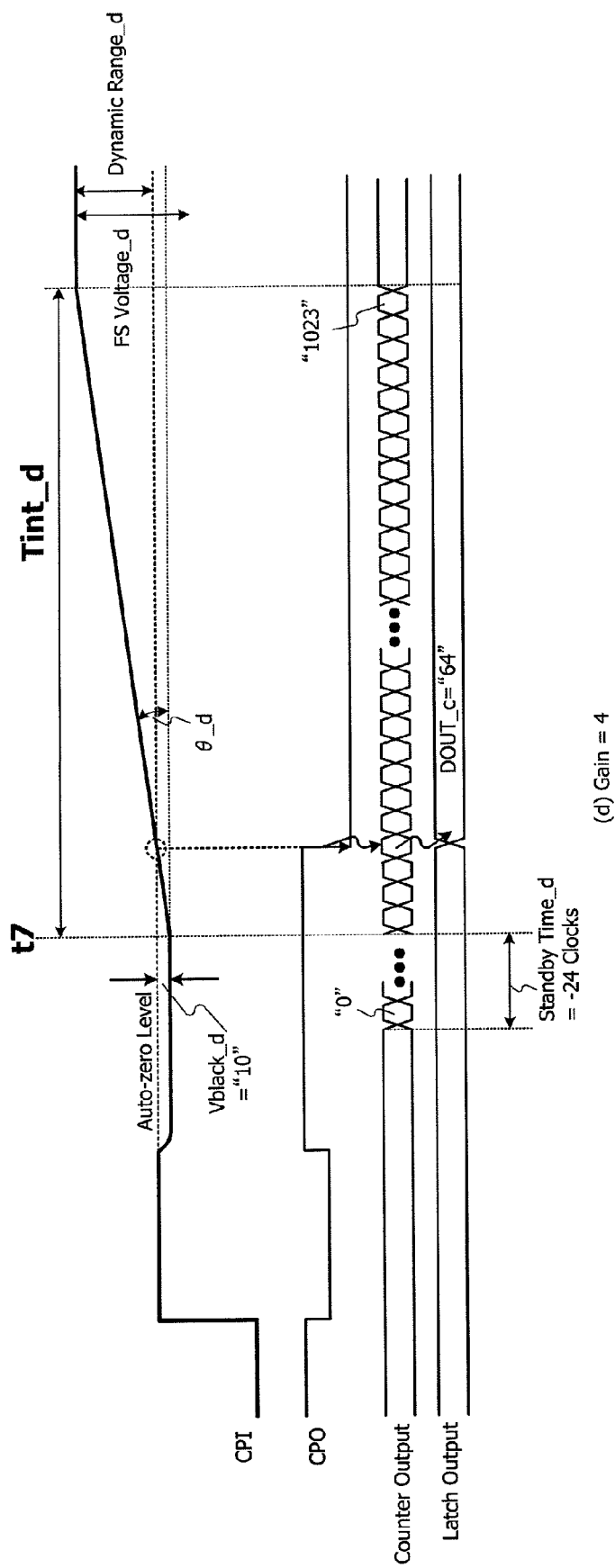
FIG. 10 is a timing chart to explain a counting start timing of a counter of a sensor system comprising an A/D converter according to the present invention in a second embodiment.

FIG. 10 shows a timing chart when only the counting start timing of the counter is adjusted in a case where the OB level (average noise voltage) is below the target noise voltage, that is, where the counter standby time Tcw_d is a negative value. A description will be made assuming that A/D converted data of each OB pixel contained in a window 1 and window 2 of an OB part 16b is about "10" LSB (dec) in this embodiment. An output value of the averaging process unit 19 shown in FIG. 8 is about "40" LSB because the A/D converted data of each OB pixel is about "10" LSB (dec) and the gain is set to 4. Therefore, an output value of the comparator is "−24" (="40"−"64") clocks provided by subtracting the value "64" LSB of the target noise voltage outputted from the target noise voltage setting circuit 20, from the value "40" LSB of the OB level outputted from the averaging process unit 19. The control circuit 18 stores the output value "−24" clocks of the comparator as a counter standby time Tcw_d.

Figure 11:
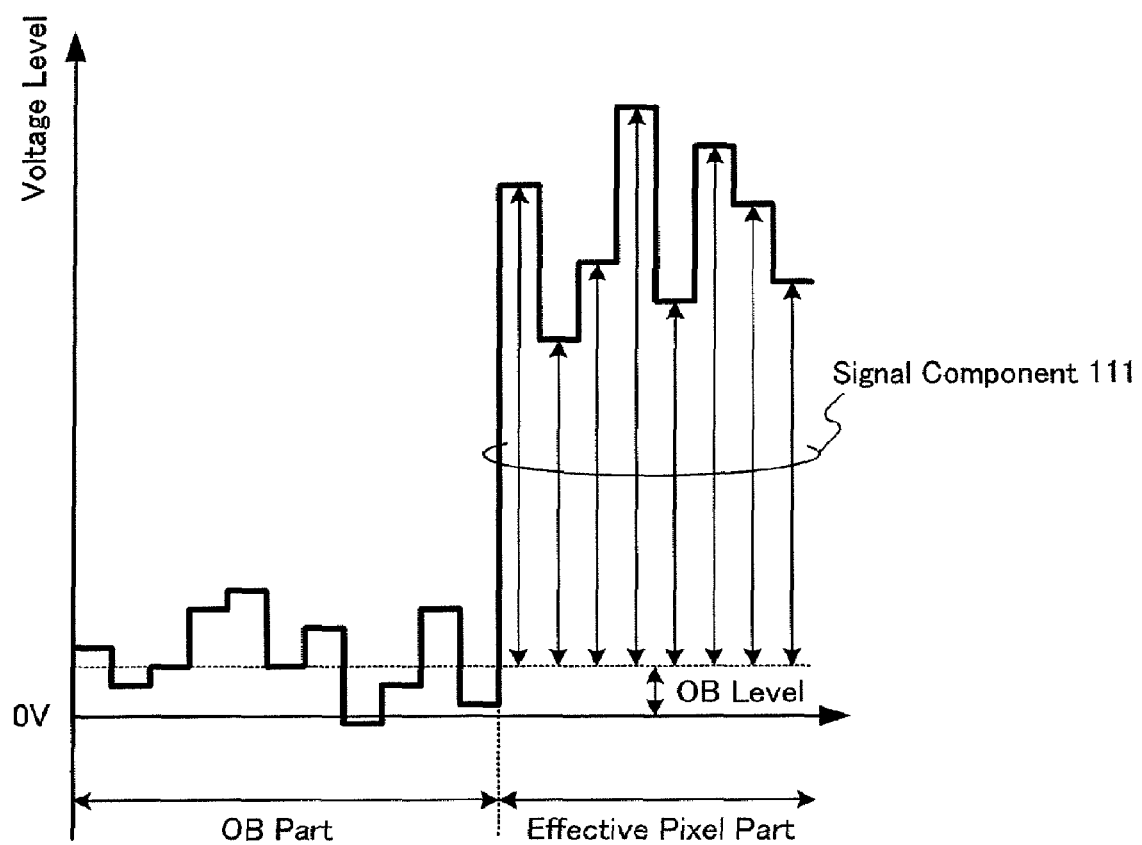
FIG. 11 is a waveform diagram showing a digital signal converted from an analog voltage outputted from each of an effective pixel part and an optical black pixel part of a sensor in the A/D converter according to the present invention in the second embodiment.

FIG. 11 shows the analog voltage to be converted outputted from each of the effective pixel part 16a and the OB part 16b when the OB level (average noise voltage) shown in FIG. 10 is below the target noise voltage. As shown in FIG. 11, when the OB level is below the target noise voltage, the voltage level of the analog voltage inputted from the OB pixel to the voltage comparison circuit 17 is almost zero, or OB pixel having a negative value exists in some cases.

Figure 12:
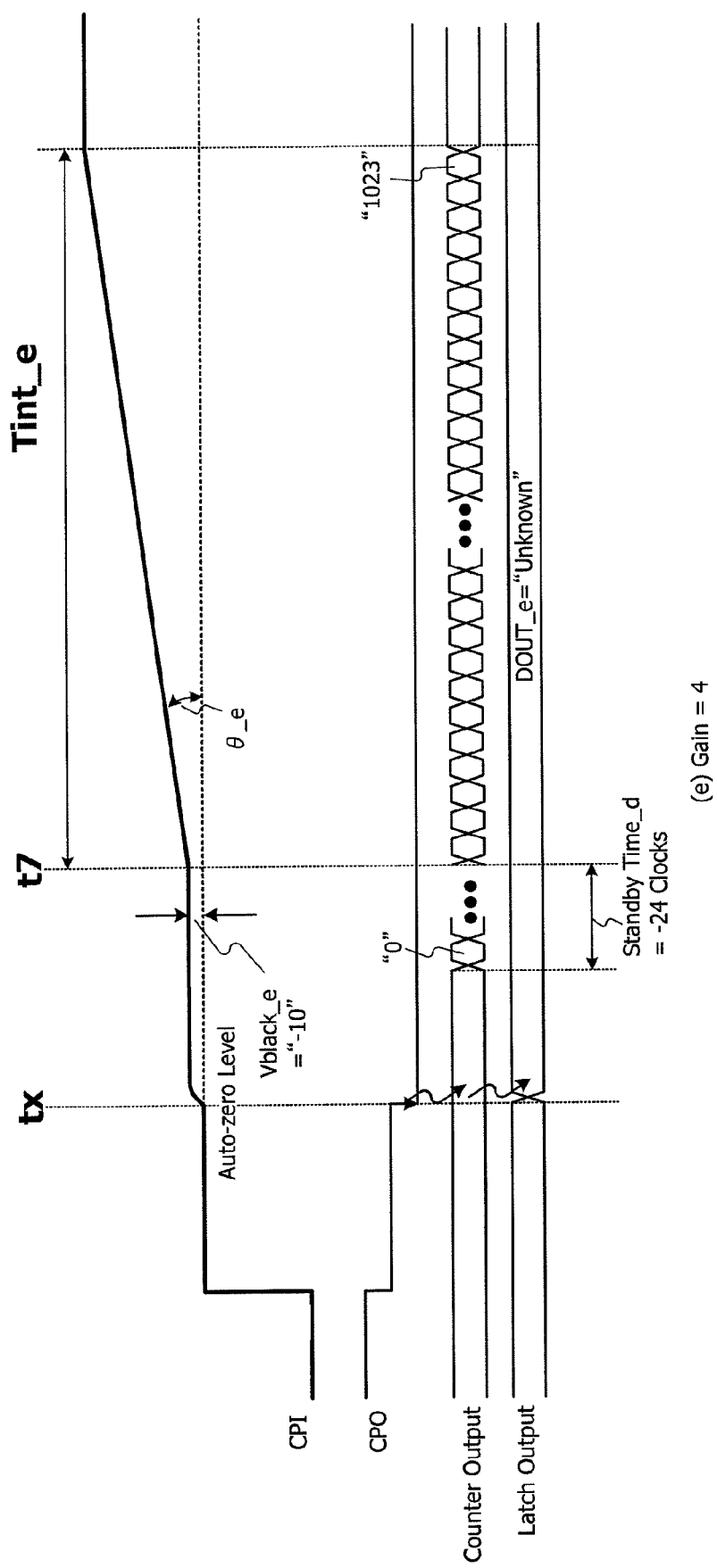
FIG. 12 is a timing chart to explain the counting start timing of the counter of the sensor system comprising the A/D converter according to the present invention in the second embodiment.

Here, FIG. 12 shows a timing chart when the analog voltage having a negative voltage level from the OB pixel is A/D converted. As shown in FIG. 12, in this case, since the polarity of an analog voltage to be converted (Vblack_e="−10" LSB) is opposite to that of the analog voltage having the positive voltage level to be converted from the pixel, the voltage level of the node CPI is above an auto-zero level (input determination voltage of the inverter circuit 12) at a time tx when sampling of the analog voltage to be converted is started. Therefore, although the latch circuit 13 is to latch the output value of the counter 15 at the time tx, since the counter 15 does not start to count yet, the A/D conversion cannot be performed normally. Therefore, when the OB level (average noise voltage) is below the target noise voltage, it is necessary to adjust the counting start timing of the counter 15 and to previously set the voltage level of the node CPI below the auto-zero level before the sampling start time tx of the analog voltage to be converted (to change it in the direction opposite to the voltage change direction of the ramp voltage).

A description will be made of control of the adjustment of the criterion level of the reference voltage at the control reference timing, in addition to the adjustment of the counting start timing of the counter 15 with respect to the control reference timing, with reference to FIGS. 13 to 15.

Figure 13:
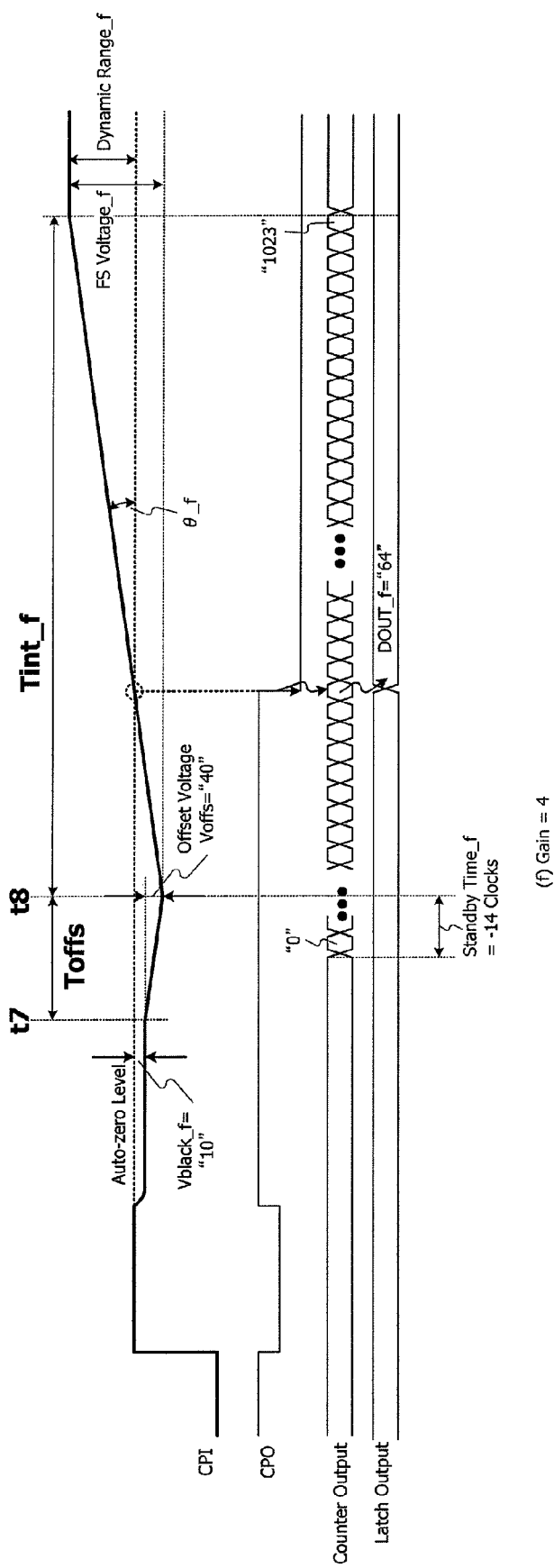
FIG. 13 is a timing chart to explain adjustment methods of the counting start timing of the counter and an offset voltage in the sensor system comprising the A/D converter according to the present invention in the second embodiment.

FIG. 13 shows a timing chart when an offset voltage is generated in the ramp voltage by inverting the operation of the ramp wave generation circuit 14 in a case where the analog voltage from the OB pixel having the negative voltage level is A/D converted.

As shown in FIGS. 13 and 14, the control circuit 18 sets an offset time Toffs to adjust the voltage level of the node CPI and sets an offset voltage Voffs that is an adjustment amount of the voltage level before the control reference timing t8. Here, according to this embodiment, as shown in FIGS. 13 and 14, a voltage level Vblack_f of the analog voltage to be converted in each OB pixel contained in the window 1 and the window 2 of the OB part 16b is about "10" LSB, and the control circuit 18 lowers the voltage level of the node CPI by "40" clocks. Thus, the offset voltage Voffs corresponds to "40" LSB.

The ramp wave generation circuit 14 inversely operates from a start time t7 of the offset time Toffs set by the control circuit 18 to lower the voltage level of the outputted ramp voltage and lower the voltage level of the node CPI. Therefore, the voltage level of the node CPI (criterion level of the reference voltage) at the control reference timing t8 is lower than the auto-zero level by "50" (="10"+"40") LSB in a pseudo-manner. In addition, the output value (the OB level) of the averaging process unit 19 at this time is "50" LSB which is the sum of a voltage level Vblack_f of the analog voltage to be converted in each OB pixel (about "10" LSB) and the offset voltage Voffs ("40" LSB).

Then, the control circuit 18 calculates a counter standby time based on an index value showing the difference between the OB level and the target noise voltage. The control circuit 18 gets a difference between the OB level (Toffs+Vblack_f) from the averaging process unit 19 and the target noise voltage (Nsp) from the target noise voltage setting circuit 20, outputted from the comparator and stores it as the counter standby time Tcw_f. The counter standby time Tcw_f can be calculated by the following formula 9 using the offset time Toffs to change the voltage level of the ramp voltage, the analog voltage Vblack_f from the OB pixel, and the target noise voltage Nsp.

$$Tcw\_f = Toffs + Vblack\_f - Nsp \qquad (9)$$

According to this embodiment, the counter standby time Tcw_f is provided such that "40"+"10"−"64"="−14" LSB from the formula (9). Therefore, as shown in FIG. 13, the control circuit 18 adjusts the counting start timing of the counter 15 by the counter standby time Tcw_f="−14" clocks (hasten 14 clocks) from the control reference timing t8. Thus, the value of the OB level of the OB part 16 can be almost equal to the value of the target noise voltage in the pseudo manner, so that the A/D conversion can be preferably performed.

In addition, the counter standby time Tcw_f stored in the control circuit 18 is used when the analog voltage from the effective pixel part 16a is A/D converted. Thus, since the value of the OB level is almost equal to the value of the target noise voltage in the pseudo manner, a dynamic range of the signal component 111 provided by photoelectric conversion contained in the analog voltage from the effective pixel part 16a shown in FIG. 11 can be sufficiently large.

Figure 15:
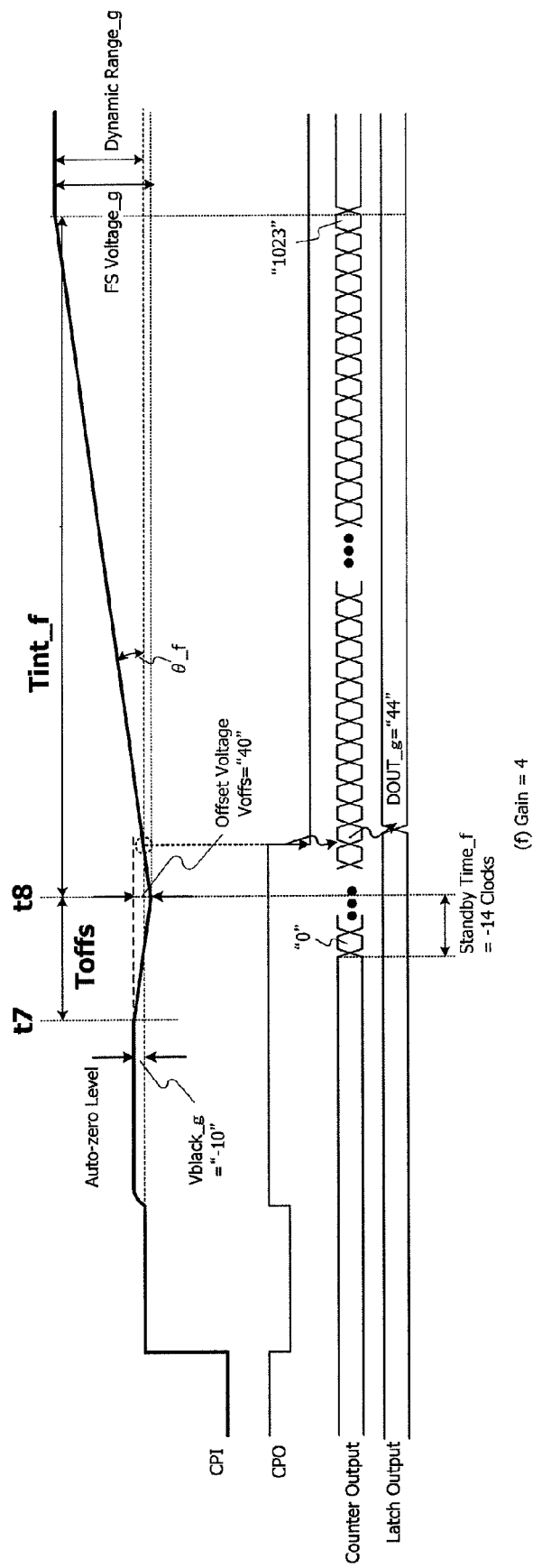
FIG. 15 is a timing chart to explain adjustment methods of the counting start timing of the counter and the offset voltage in the sensor system comprising the A/D converter according to the present invention in the second embodiment.

FIG. 15 shows one example of a timing chart in a case where the analog voltage from the OB pixel having the negative voltage level is A/D converted. As shown in FIG. 15, the voltage level of the analog voltage to be converted from the OB pixel corresponds to Vblack_g="−10" LSB, a standby time Tcw_f in this case is "−14" LSB as described above. At this time, an A/D converted result Dout_g outputted from the latch circuit 13 is calculated by the following formula 10.

$$Dout\_g = Vblack\_g + Voffs - Tcw\_f \qquad (10)$$

Therefore, in the case shown in FIG. 15, the A/D converted result is such that Dout_g="−10"+"40"−"−14"="44" LSB.

Thus, in the case where the OB level (average noise voltage) is below the target noise voltage, when the criterion level of the reference voltage at the control reference timing is adjusted in addition to the adjustment of the counting start timing of the counter 15 with respect to the control reference timing, the A/D conversion can be preferably performed regardless of the case the difference between the OB level (average noise voltage) and the target noise voltage is positive or negative.

Third Embodiment

Figure 18:
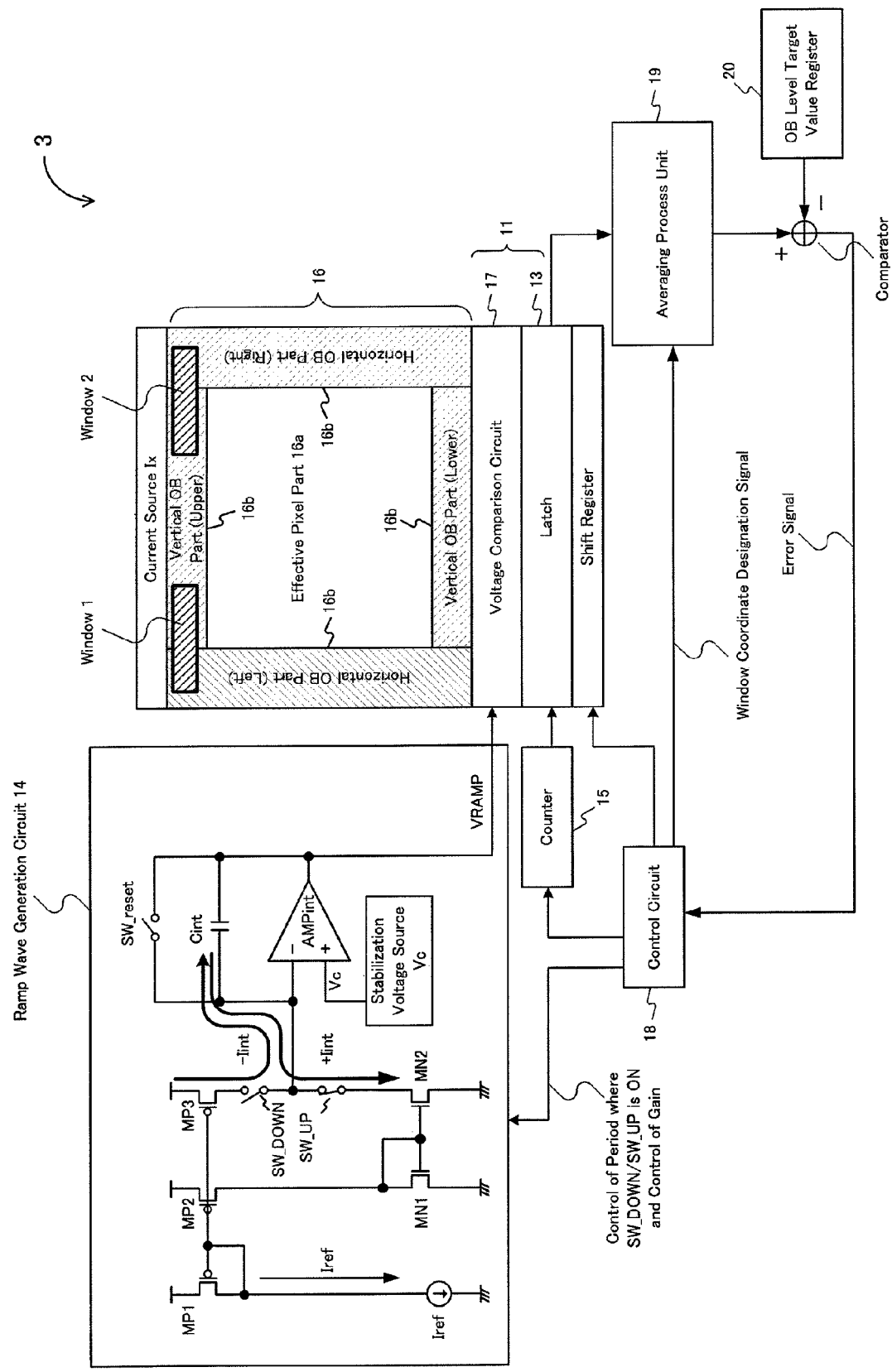
FIG. 18 is a schematic block diagram showing a schematic constitution of the sensor system comprising the A/D converter according to the present invention in the fourth embodiment.

A third embodiment of an A/D converter according to the present invention and a sensor system comprising the A/D converter will be described with reference to FIGS. 16 and 18. Although the description has been made of the case where the counting start timing of the counter is adjusted with respect to the control reference timing in the above first and second embodiments, a description will be made of a case where the criterion level of the reference voltage at the counting start timing is adjusted in this embodiment.

First, constitutions of the A/D converter and sensor system of this embodiment will be described with reference to FIG. 18. The constitutions of the A/D converter and the sensor system in this embodiment are basically the same as those of the A/D converter and the sensor system in the first and second embodiments.

A control circuit 18 in this embodiment calculates an index value showing a difference between an OB level (average noise voltage) and a target noise voltage, calculates an adjustment amount of a criterion level of a reference voltage at the counting start timing based on the index value, and changes the criterion level of the reference voltage in the voltage change direction of the ramp voltage before the counting start timing based on the adjustment amount.

An operation of the sensor system in this embodiment will be described with reference to FIG. 16. Here, FIG. 16 is a timing chart to explain the adjustment of the criterion level of the reference voltage at the counting start timing in this embodiment.

The control circuit 18 in this embodiment operates a ramp wave generation circuit 14 for a certain period before the control reference timing t9 to change the criterion level of the reference voltage in the voltage change direction of the ramp voltage (here, in the increasing direction). The increased amount of the ramp voltage $V_{RAMP}$ is defined by an operation time Tup of the ramp wave generation circuit 14. The operation time Tup of the ramp wave generation circuit 14 is calculated by the following formula 11 using an OB level (average noise voltage level) Vblack and a target noise voltage level Nsp.

$$Tup = Vblack - Nsp \qquad (11)$$

Figure 16:
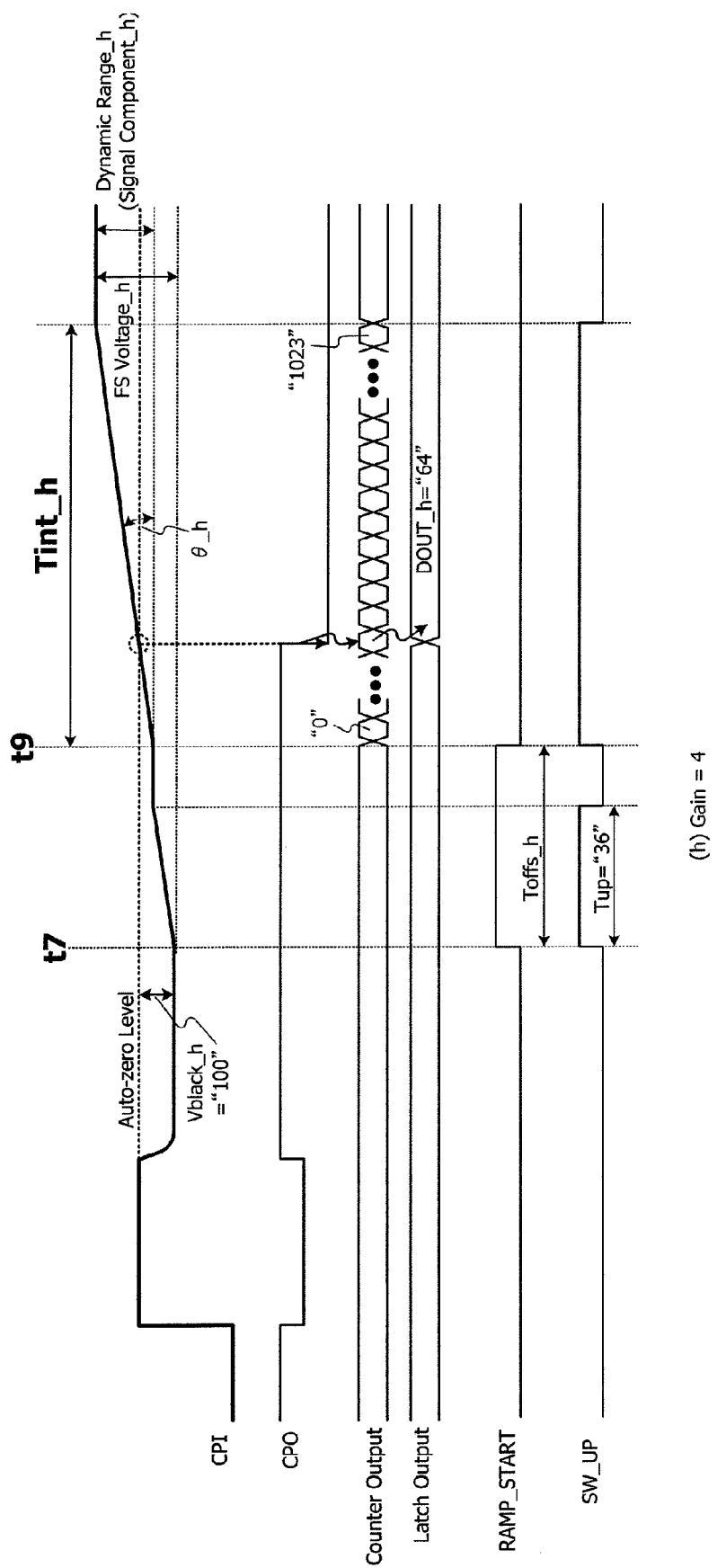
FIG. 16 is a timing chart to explain adjustment of a criterion level of a reference voltage of a sensor system comprising an A/D converter according to the present invention in a fourth embodiment.

Here, according to this embodiment, as shown in FIG. 16, an A/D converted data value Vblack_h converted from an analog voltage from an OB pixel is "100" LSB and the target noise voltage level Nsp is "64" LSB. Therefore, the operation time Tup of the ramp wave generation circuit 14 is such that "100"−"64"="36" clocks.

As shown in FIG. 16, the control circuit 18 operates the ramp wave generation circuit 14 to increase the ramp voltage for the operation time Tup from a time t7. As a result, the voltage level of the node CPI is increased by "36" LSB level from the voltage level at a sampling time of the analog voltage to be converted. In addition, the time t7 is a starting time of a time Toffs_h assigned to adjust the criterion level set just before the control reference timing t9. The time Toffs_h is previously set in view of circuit characteristics and the like of the sensor system 3.

Then, as shown in FIG. 16, the control circuit 18 outputs the ramp voltage of the ramp wave generation circuit 14 for an integral time Tint_h, that is, from a fall of a signal RAMP_START (control reference timing t9) to a fall of a signal SW_UP (completion time of the operation time Tint_h of the ramp wave generation circuit 14). Here, the integral time Tint_h is a fixed time defined by the same clock number as resolution of the A/D converter. According to this embodiment, since the resolution of the A/D converter (bit number of the counter) is 10 bits, the integral time Tint_h corresponds to "1024(=$2^{10}$)" clocks.

As shown in FIG. 16, according to this embodiment, the criterion level of the reference voltage, that is, the voltage level of the node CPI is increased from the voltage level Vblack_h(="100" LSB) at the sampling time of the analog voltage to be converted by a level of "36" LSB. In this case, when the reference voltage is increased by a level of "64 (=100−36)" LSB, the voltage level of the node CPI exceeds an auto-zero level that is a level where the output of the inverter circuit 12 is switched. The output value of the counter 15 at this time is "64" LSB and an A/D converted result DOUT_h is "64" LSB. Therefore, when the criterion level of the reference voltage at the counting start timing is changed, the OB level can be set to the value of the target noise voltage in a pseudo manner.

Fourth Embodiment

A fourth embodiment of an A/D converter according to the present invention and a sensor system comprising the A/D converter will be described with reference to FIGS. 17 and 18. According to this embodiment, a description will be made of a case where a control circuit 18 performs different settings between cases where OB levels (average noise voltages) are above and below a target noise voltage.

First, constitutions of the A/D converter and sensor system of this embodiment will be described with reference to FIG. 18. The constitutions of the A/D converter and the sensor system in this embodiment are basically the same as those of the A/D converter and the sensor system in the third embodiment.

The control circuit 18 in this embodiment calculates an adjustment amount of a criterion level of a reference voltage at a counting start timing based on an index value showing a difference between the OB level (average noise voltage) and a target noise voltage. Then, when the OB level (average noise voltage) is above the target noise voltage, it changes the criterion level of the reference voltage in the voltage change direction of the ramp voltage before the counting start timing based on the adjustment amount. Alternatively, when the OB level (average noise voltage) is below the target noise voltage, it changes the criterion level of the reference voltage in the direction opposite to the voltage change direction of the ramp voltage based on the adjustment amount.

An operation of the sensor system in this embodiment will be described with reference to FIG. 17. Here, FIG. 17 is a timing chart to explain the adjustment of the criterion level of the reference voltage at the counting start timing.

In addition, when the OB level (average noise voltage) is above the target noise voltage, the control circuit 18 in this embodiment performs the same process as those in the third embodiment.

Meanwhile, when the OB level (average noise voltage) is below the target noise voltage, the control circuit 18 in this embodiment inversely operates a ramp wave generation circuit 14 for a certain period before a control reference timing t9 to change the criterion level of the reference voltage in a direction opposite to the voltage change direction of the ramp voltage (here, in a decreasing direction). A decreased amount of the ramp voltage $V_{RAMP}$ is defined by an inversion operation time Tdown of the ramp wave generation circuit 14. The inversion operation time Tdown of the ramp wave generation circuit 14 is calculated by the following formula 12 using the OB level (average noise voltage level) Vblack and the target noise voltage level Nsp.

$$Tdown = Vblack - Nsp \quad (12)$$

Figure 17:
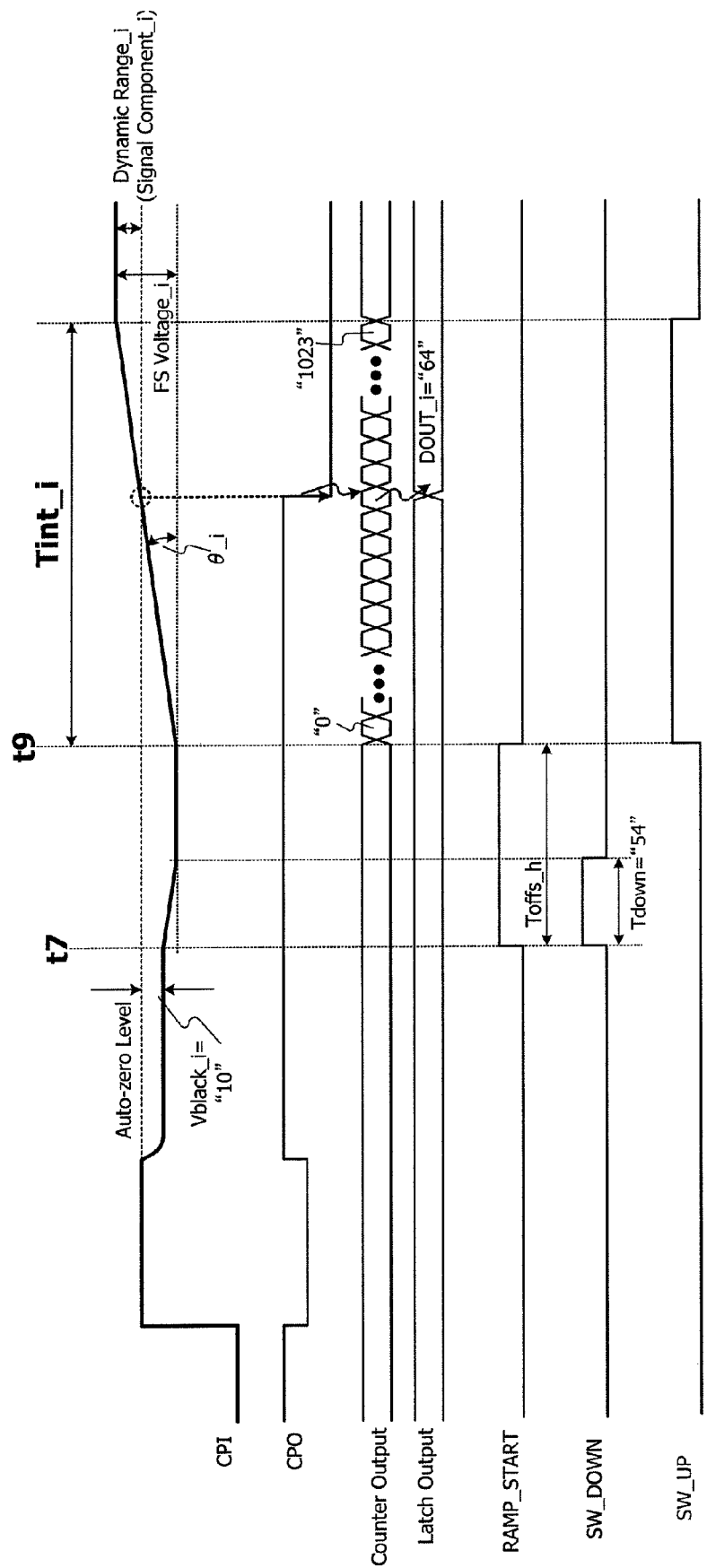
FIG. 17 is a timing chart to explain adjustment of a criterion level of a reference voltage of a sensor system comprising an A/D converter according to the present invention in a fifth embodiment.

Here, according to this embodiment, as shown in FIG. 17, an A/D converted data value Vblack_i converted from an analog voltage from an OB pixel is "10" LSB and the target noise voltage level Nsp is "64" LSB. Therefore, the inversion operation time Tdown of the ramp wave generation circuit 14 is such that "10"−"64"="54" clocks.

As shown in FIG. 17, the control circuit 18 inversely operates the ramp wave generation circuit 14 to decrease the ramp voltage for the inversion operation time Tdown from a time t7. As a result, the voltage level of the node CPI is decreased by "54" LSB level from the voltage level at a sampling time of the analog voltage to be converted. In addition, the time t7 is a starting time of a time Toffs_h assigned to adjust the criterion level set just before the control reference timing t9 similar to the third embodiment. The time Toffs_h is previously set in view of circuit characteristics and the like of the sensor system 3.

Then, as shown in FIG. 17, the control circuit 18 outputs the ramp voltage of the ramp wave generation circuit 14 for an integral time Tint_i, that is, from a fall of a signal RAMP_START (control reference timing t9) to a fall of a signal SW_UP (completion time of the integral time Tint_i). Here, the integral time Tint_i is a fixed time defined by the same clock number as resolution of the A/D converter similar to the third embodiment, and it corresponds to "1024(=$2^{10}$)" clocks.

As shown in FIG. 17, according to this embodiment, the voltage level of the node CPI(criterion level of the reference voltage) is decreased from the voltage level Vblack_i (="10" LSB) at the sampling time of the analog voltage to be converted by a level of "54" LSB. In this case, when the reference voltage is increased by a level of "64 (=10+54)" LSB, the voltage level of the node CPI exceeds an auto-zero level. The output value of the counter 15 at this time is "64" LSB and an A/D converted result DOUT_i is "64" LSB. Therefore, when the criterion level of the reference voltage at the counting start timing is changed, the OB level can be set to the value of the target noise voltage in a pseudo manner.

Fifth Embodiment

The ramp wave generation circuit 14 used in the A/D converter according to the present invention and the sensor system comprising the above A/D converter will be described with reference to FIGS. 19 and 20.

Figure 19:
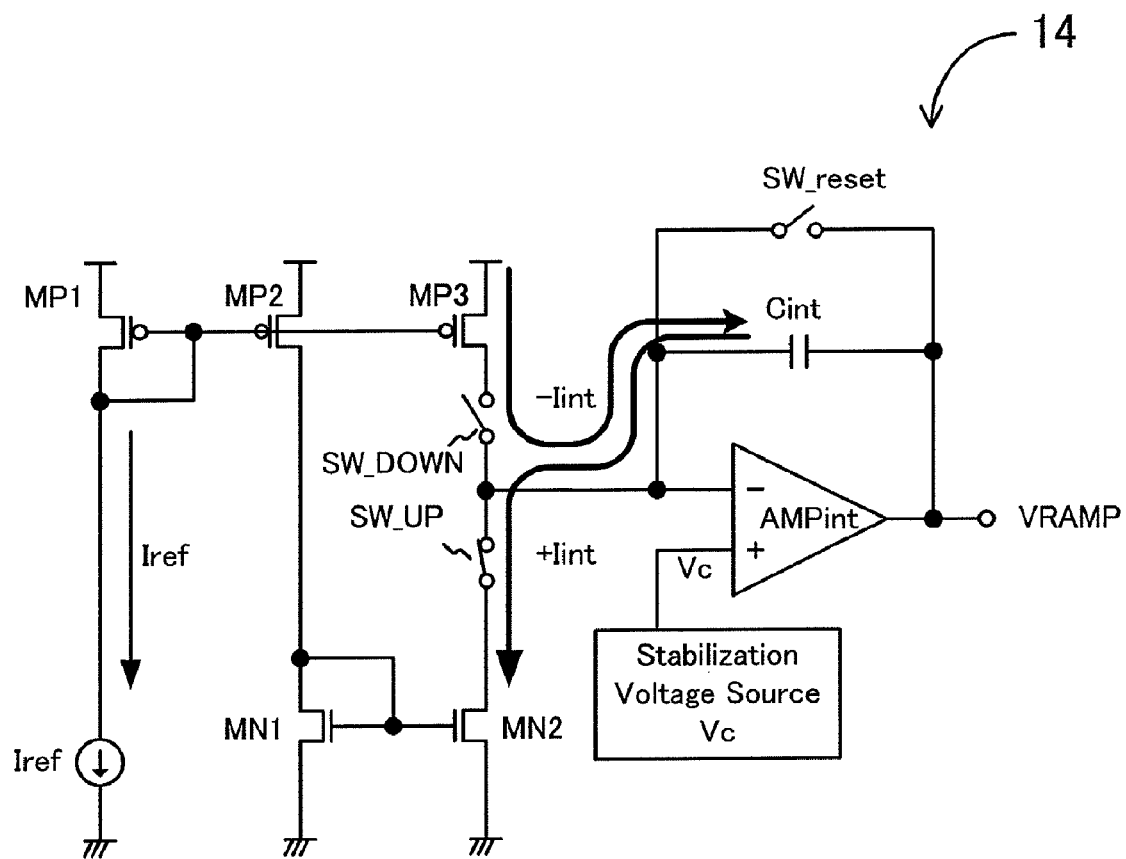
FIG. 19 is a circuit diagram showing a schematic constitution example of a ramp voltage generation circuit used in the sensor system comprising the A/D converter according to the present invention.
Figure 20:
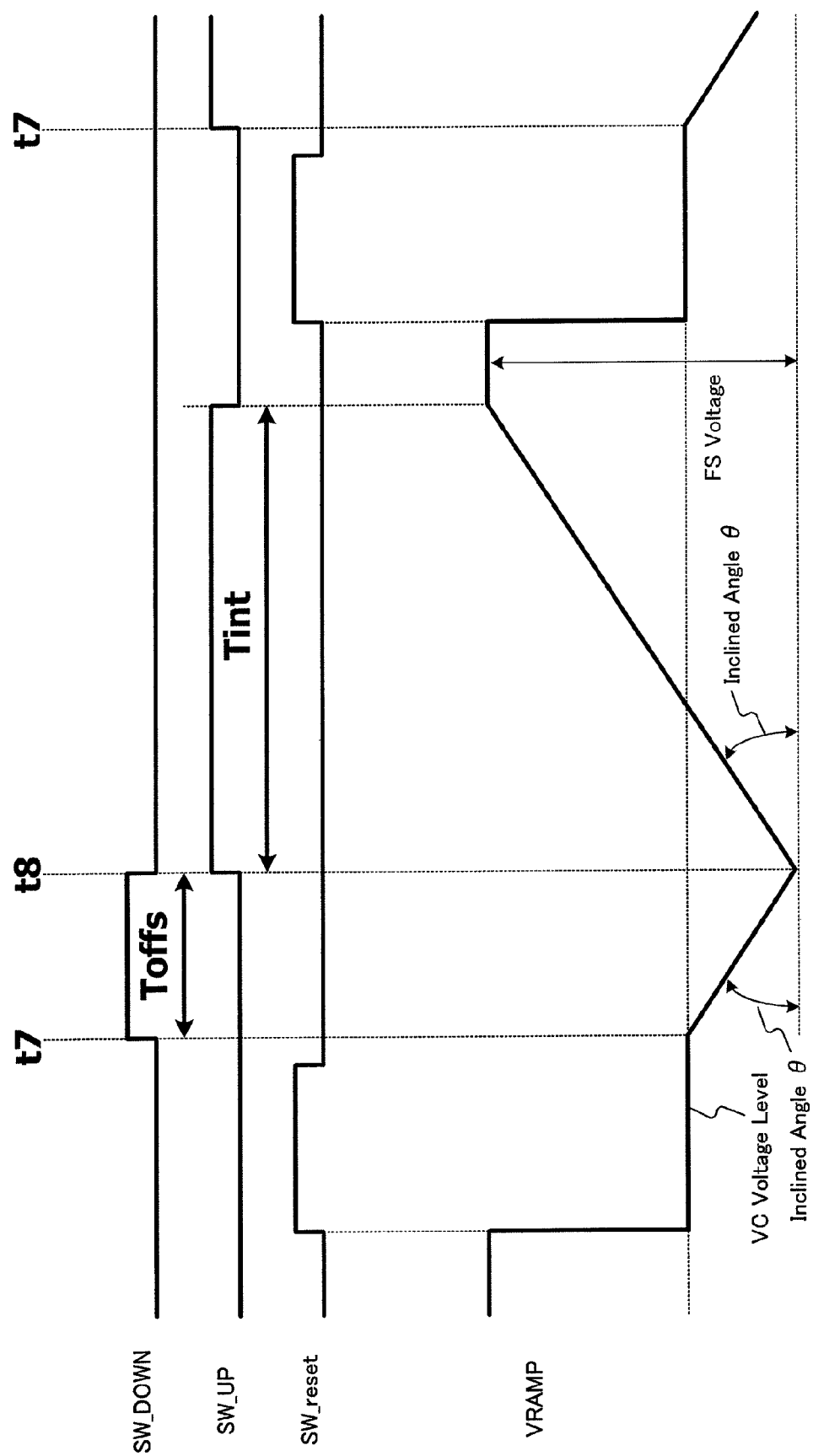
FIG. 20 is a timing chart to explain an operation of the ramp voltage generation circuit used in the sensor system comprising the A/D converter according to the present invention.

FIG. 19 is a circuit diagram showing a schematic constitution example of the ramp wave generation circuit 14 according to this embodiment, and FIG. 20 is a timing chart to explain the operation of the ramp wave generation circuit 14 shown in FIG. 19.

As shown in FIG. 19, the ramp wave generation circuit 14 comprises a first current mirror circuit and a second current mirror circuit that duplicate a current value from a constant current source Iref, an integral capacity Cint charged by a current duplicated by the first current mirror circuit and discharged by a current duplicated by the second current mirror circuit, and a switch circuits SW_DOWN and SW_UP to alternatively switch charging by the first current mirror circuit and discharging by the second current mirror circuit for the integral capacity Cint. The ramp wave generation circuit 14 according to this embodiment further comprises a stabilization voltage source Vc, a differential amplifier AMPint, and a reset switch SW_reset, and a definite integrator consists of the stabilization voltage source Vc, the integral capacity Cint, and the reset switch SW_reset.

The first current mirror circuit comprises PMOS transistors MP1 to MP3. In the first current mirror circuit, a constant current Iref supplied from the constant current source Iref is duplicated through the PMOS transistor MP3 as a current −Iint. The second current mirror circuit comprises PMOS transistors MP1 and MP2 and NMOS transistors MN1 and MN2. In the second current mirror circuit, the constant current Iref supplied from the constant current source Iref is duplicated through the NMOS transistor MN2 as a current +Iint.

The ramp wave generation circuit 14 changes the ramp voltage in the increasing direction by turning the switch circuit SW_UP on and turning the switch circuit SW_DOWM off, and changes the ramp voltage in the decreasing direction by turning the switch circuit SW_UP off and turning the switch circuit SW_DOWM on.

Next, an operation principle of the ramp wave generation circuit 14 will be described.

When the integral capacity Cint is charged by the first current mirror circuit (when the current −Iint is injected), the ramp voltage $V_{RAMP}$ that is the output voltage of the ramp wave generation circuit 14 is changed in the decreasing direction. The ramp voltage $V_{RAMP}$ at this time is calculated by the following formula 13 assuming that an integral time is Toffs.

$$V_{RAMP} = -(\text{Iint}/\text{Cint}) \times \text{Toffs} + V_c \quad (13)$$

When the integral capacity Cint is discharged by the second current mirror circuit (when the current +Iint is drawn), the ramp voltage $V_{RAMP}$ is changed in the increasing direction. The ramp voltage $V_{RAMP}$ at this time is calculated by the following formula 14 assuming that an integral time is Tint.

$$V_{RAMP} = +(\text{Iint}/\text{Cint}) \times \text{Tint} + V_c \quad (14)$$

In addition, when it is assumed that a current mirror ratio of the constant current source Iref to the current ±Iint is M, the formula 13 can be expressed by the following formula 15 and the formula 14 can be expressed by the following formula 16.

$$V_{RAMP} = -M \times (\text{Iref}/\text{Cint}) \times \text{Toffs} + V_c \quad (15)$$

$$V_{RAMP} = +M \times (\text{Iref}/\text{Cint}) \times \text{Tint} + V_c \quad (16)$$

Therefore, inclination θ (voltage change amount per unit time) is expressed by the following formulas 17 and 18 based on the formulas 15 and 16.

$$\theta = -M \times (\text{Iref}/\text{Cint}) \quad (17)$$

$$\theta = +M \times (\text{Iref}/\text{Cint}) \quad (18)$$

An operation timing of the ramp wave generation circuit 14 will be described with reference to FIG. 20 hereinafter.

The ramp wave generation circuit 14 sets the reset switch SW_reset to a conduction state to reset (discharge) the integral capacity Cint shown in FIG. 19 before the analog voltage from the pixel part 16 to be converted is sampled every time.

When the offset time Toffs is set by the control circuit 18, the ramp wave generation circuit 14 sets the switch circuit SW_DOWN to H level (on state) and the switch circuit SW_UP to L level (off state) at a timing t7 of the starting time of the offset time Toffs in order to change the ramp voltage $V_{RAMP}$ to the decreasing direction. The ramp wave generation circuit 14 sets the switch circuit SW_DOWN to L level (off state) at a time t8 after a lapse of offset time Toffs. The ramp voltage $V_{RAMP}$ and the inclination θ at this time are expressed by the formulas 15 and 17, respectively. As shown in the formulas 13 and 15, the decreased amount of the ramp voltage $V_{RAMP}$ can be controlled by the integral time Toffs.

The ramp wave generation circuit 14 sets the switch circuit SW_DOWN to L level (off state) and the switch circuit SW_UP to H level (on state) for the operation time Tint from the control reference timing t8 in order to change the ramp voltage $V_{RAMP}$ to the increasing direction. The ramp wave generation circuit 14 sets the switch circuit SW_UP to L level (off state) after a lapse of the operation time Tint. As shown in the formulas 14 and 16, the increased amount of the ramp voltage $V_{RAMP}$ can be controlled by the integral time Tint.

As described above, when the inclination θ of the ramp voltage $V_{RAMP}$ is adjusted, the gain of the A/D converter can be set. According to the formulas 17 and 18, since the inclination θ is defined by a function using the current mirror ratio M, the constant current source Iref and the integral capacity Cint as parameters, the inclination θ can be adjusted by adjusting one or more of the current mirror ratio M, the constant circuit source Iref, and the integral capacity Cint.

Another Embodiment (1) In the fifth embodiment, the constant circuit source Iref of the ramp wave generation circuit 14 shown in FIG. 19 may comprise a constant voltage source, and a resistive load to convert a voltage generated from the constant voltage source to a constant current contributing to the charging and discharging of the capacitive load, and the resistive load may comprise a switched capacitor.

Figure 22:
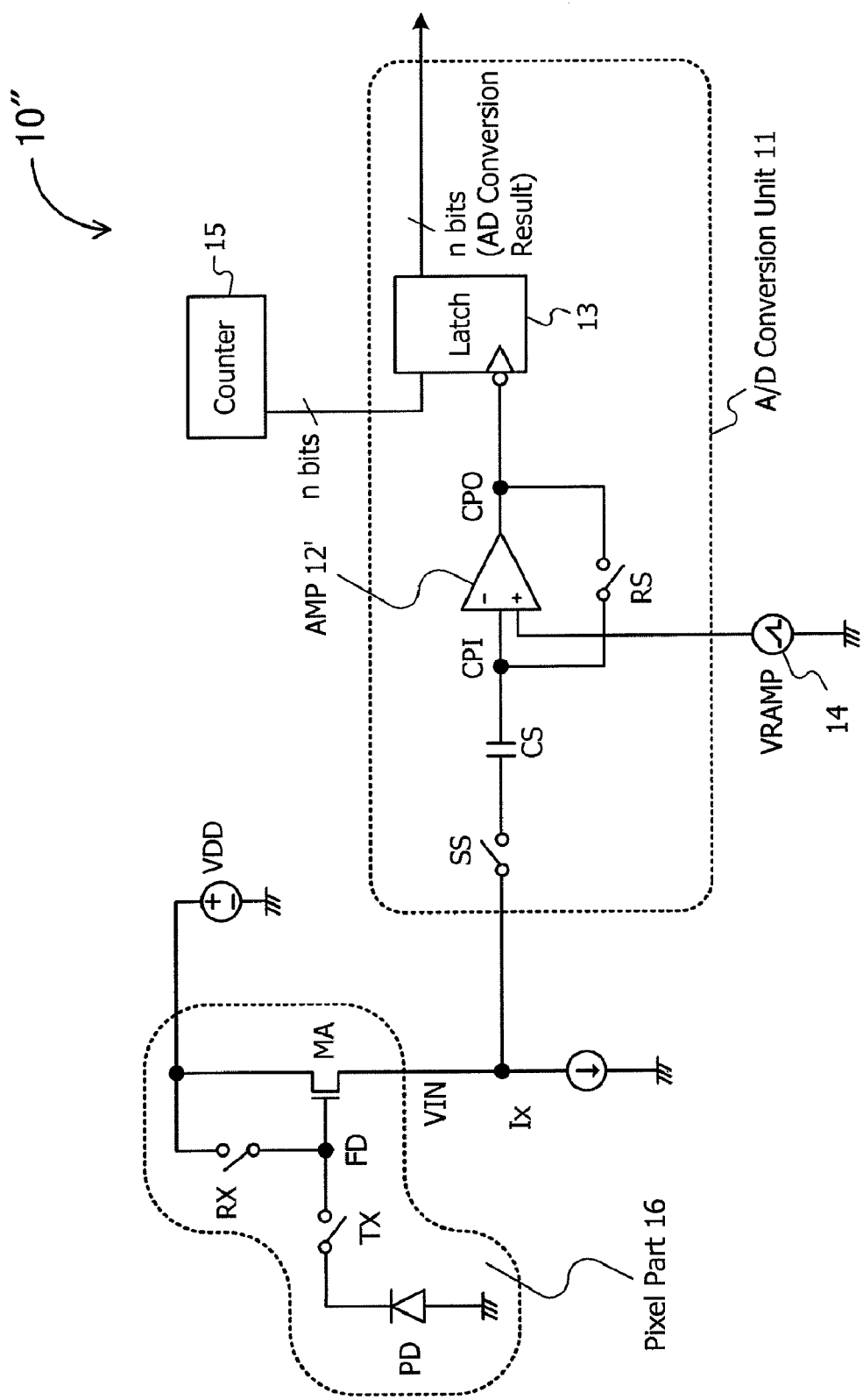
FIG. 22 is a schematic circuit diagram showing a schematic constitution example of an A/D conversion unit used in a sensor system comprising an A/D converter according to the present invention in still another embodiment.

(2) Although the description has been made of the case where the arithmetic unit comprises the inverter circuit 12 in the above first to fifth embodiments, the constitution of the arithmetic unit is not limited to this. As shown in FIG. 22, the arithmetic unit may comprise a differential input type of operation amplifier receiving the analog voltage to be converted and the ramp voltage as its input voltages.

Figure 21:
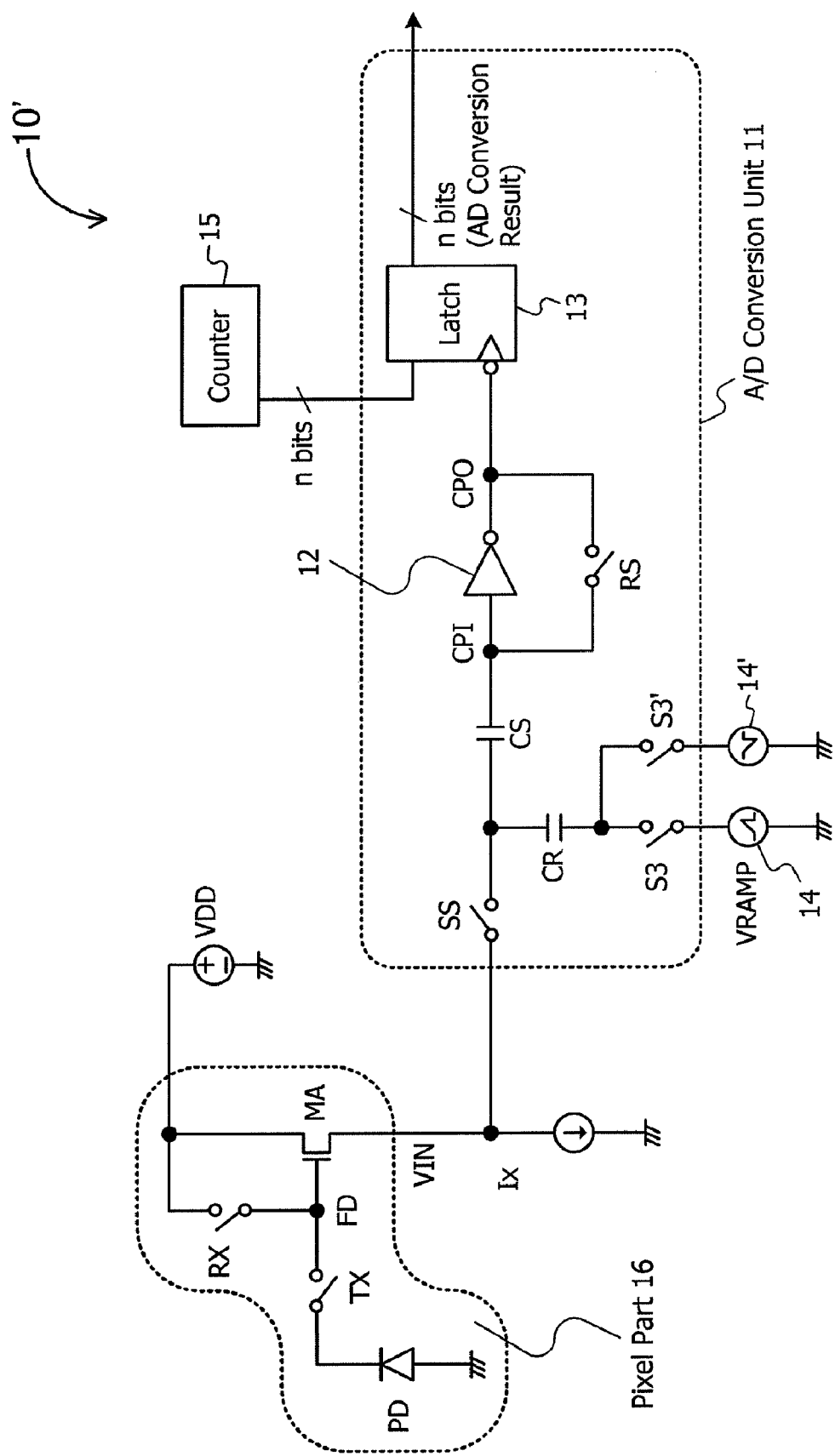
FIG. 21 is a schematic circuit diagram showing a schematic constitution example of an A/D conversion unit used in a sensor system comprising an A/D converter according to the present invention in another embodiment.

(3) Although the description has been made of the case where the control circuit 18 inversely operates the ramp wave generation circuit 14 when it changes the criterion level of the reference voltage in the direction opposite to the voltage change direction of the ramp voltage in the above first to fifth embodiments, the present invention is not limited to this. As shown in FIG. 21, an A/D conversion unit 11 may comprise a ramp wave generation circuit 14' having a polarity opposite to that of the ramp wave generation circuit 14, and a switch S3' to switch the ramp wave generation circuit 14 and the ramp wave generation circuit 14' connected to the arithmetic unit such that the criterion level of the reference voltage may be changed by switching the switch S3 and the switch S3'.

Although the present invention has been described in terms of the preferred embodiment, it will be appreciated that various modifications and alternations might be made by those skilled in the art without departing from the spirit and scope of the invention. The invention should therefore be measured in terms of the claims which follow.

What is claimed is:

1. An A/D converter comprising:
   a ramp voltage generation circuit generating a ramp voltage having a voltage value changing monotonically for a certain period;
   a voltage comparison circuit comprising an arithmetic unit sampling and holding an analog voltage to be converted and comparing the sampled and held analog voltage to be converted, with a reference voltage given by a voltage change value of the ramp voltage generated from the ramp voltage generation circuit or a voltage value proportional to the voltage change value, and changing an output when the reference voltage equals the analog voltage to be converted;
   a counter counting a digital value corresponding to the reference voltage and outputting the digital value;
   a latch circuit latching the digital value outputted from the counter when the output of the voltage comparison circuit is changed and outputting the digital value;
   an averaging process circuit averaging a noise component contained in the analog voltage to be converted to obtain an average noise voltage;
   a target noise voltage setting circuit setting a target noise voltage as a target value of the average noise voltage; and
   a control circuit performing at least one adjustment of a counting start timing of the counter with respect to a control reference timing at which the reference voltage starts to change from a criterion level by the ramp voltage generation circuit, or adjustment of the criterion level of the reference voltage at the counting start timing of the counter, based on a difference between the average noise voltage and the target noise voltage.

2. The A/D converter according to claim 1, wherein
the control circuit calculates an index value showing the difference between the average noise voltage and the target noise voltage, and a counter standby time to adjust the counting start timing of the counter in accordance with the index value, and adjusts the counting start timing of the counter in accordance with the counter standby time.

3. The A/D converter according to claim 1, wherein
the control circuit calculates an index value showing the difference between the average noise voltage and the target noise voltage, and a counter standby time to adjust the counting start timing of the counter in accordance with the index value, and delays the counting start timing with respect to the control reference timing in accordance with the counter standby time when the average noise voltage is above the target noise voltage, or hastens the counting start timing with respect to the control reference timing in accordance with the counter standby time when the average noise voltage is below the target noise voltage, and further calculates an adjustment amount of the criterion level of the reference voltage at the control reference timing based on the index value and changes the criterion level of the reference voltage by the adjustment amount in a direction opposite to a voltage change direction of the ramp voltage before the control reference timing.

4. The A/D converter according to claim 1, wherein
the control circuit calculates an index value showing the difference between the average noise voltage and the target noise voltage, and an adjustment amount of the criterion level of the reference voltage at the counting start timing based on the index value, and changes the criterion level of the reference voltage based on the adjustment amount in a voltage change direction of the ramp voltage before the counting start timing.

5. The A/D converter according to claim 4, wherein
when the average noise voltage is below the target noise voltage, the control circuit calculates an adjustment amount of the criterion level of the reference voltage at the counting start timing based on the index value, and changes the criterion level of the reference voltage based on the adjustment amount in a direction opposite to a voltage change direction of the ramp voltage before the counting start timing.

6. The A/D converter according to claim 1, wherein
the ramp voltage generation circuit comprises a first current mirror circuit and a second current mirror circuit that duplicate a current value from a constant current source, an integral capacity charged by a current duplicated by the first current mirror circuit and discharged by a current duplicated by the second current mirror circuit, and a switch circuit alternatively switching between charging the integral capacity by the first current mirror circuit and discharging the integral capacity by the second current mirror circuit.

7. The A/D converter according to claim 1, wherein
the arithmetic unit comprises an inverter circuit, and
a voltage synthetic circuit generating a composite voltage as an input voltage of the inverter circuit, the composite voltage provided by adding a difference voltage between the analog voltage to be converted and the reference voltage, to an input determination voltage of the inverter circuit.

8. The A/D converter according to claim 1, wherein
the arithmetic unit comprises a differential input type of operation amplifier receiving the analog voltage to be converted and the ramp voltage as input voltages.

9. The A/D converter according to claim 1, wherein
the control circuit inversely operates the ramp voltage generation circuit when the criterion level of the reference voltage is changed in a direction opposite to a voltage change direction of the ramp voltage.

10. A sensor system comprising:
a sensor having a plurality of photoelectric conversion elements arranged in a matrix;
a plurality of A/D conversion units each provided in each column of the sensor, the A/D conversion units comprising the voltage comparison circuit and the latch circuit of the A/D converter according to claim 1;
the ramp voltage generation circuit, the counter, the averaging process circuit, the target noise voltage setting circuit, and the control circuit, of the A/D converter, wherein
an optical black pixel part shielded from light is provided at a part of marginal portions of the sensor, and
the averaging process circuit averages A/D converted values of the A/D conversion unit from an output signal of the optical black pixel part to get the average noise voltage.

* * * * *